(12) United States Patent
Gao et al.

(10) Patent No.: US 11,217,609 B1
(45) Date of Patent: Jan. 4, 2022

(54) ARRAY SUBSTRATE, MOTHERBOARD OF ARRAY SUBSTRATE, DISPLAY PANEL, AND METHOD FOR FORMING DISPLAY PANEL

(71) Applicant: Shanghai Tianma AM-OLED Co., Ltd., Shanghai (CN)

(72) Inventors: Zhuan Gao, Shanghai (CN); Xinzhao Liu, Shanghai (CN); Mengmeng Zhang, Shanghai (CN); Xingyao Zhou, Shanghai (CN); Yana Gao, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 17/172,718

(22) Filed: Feb. 10, 2021

(30) Foreign Application Priority Data

Nov. 27, 2020 (CN) .......................... 202011360204.8

(51) Int. Cl.
| | |
|---|---|
| *H01L 27/12* | (2006.01) |
| *H01L 25/18* | (2006.01) |
| *H01L 21/66* | (2006.01) |
| *G09G 3/36* | (2006.01) |
| *H01L 21/78* | (2006.01) |

(Continued)

(52) U.S. Cl.
CPC ......... *H01L 27/124* (2013.01); *G09G 3/3648* (2013.01); *H01L 22/32* (2013.01); *H01L 25/18* (2013.01); *G02F 1/13452* (2013.01); *G02F 1/136286* (2013.01); *G09G 3/3225* (2013.01); *G09G 2300/0809* (2013.01);

(Continued)

(58) Field of Classification Search
CPC ........... H01L 27/1262; G02F 1/136286; G02F 1/13458; G02F 2001/136295; G02F 2001/136254; G09G 3/006; G09G 2330/12; G01R 31/2844
See application file for complete search history.

(56) References Cited

U.S. PATENT DOCUMENTS

| | | | | |
|---|---|---|---|---|
| 2009/0213288 A1* | 8/2009 | Chen | ...................... | G02F 1/1303 349/43 |
| 2013/0265069 A1* | 10/2013 | Deng | ...................... | G09G 3/006 324/750.3 |

(Continued)

FOREIGN PATENT DOCUMENTS

| | | |
|---|---|---|
| CN | 107329298 A | 11/2017 |
| CN | 108399900 A | 8/2018 |

*Primary Examiner* — Shaheda A Abdin
(74) *Attorney, Agent, or Firm* — Anova Law Group, PLLC

(57) ABSTRACT

Array substrates, motherboards of array substrates, display panels and method for forming display panels are provided. The array substrate includes sub-pixels, data lines, multiple-channel distribution units, X first switch control lines, test units and N second switch control lines. The first output terminals of the X first switch elements of a same multiple distribution unit are connected to the X data lines of the same data line group. The first control terminals of the X first switch elements of each multiple-channel distribution unit are connected to the X first switch control lines. The second output terminals of the second switch elements in a same test unit are electrically connected to the first input end of the first switch elements in the same multiple-channel distribution unit. The second control terminals of the N second switch elements in each test unit are connected to the N second switch control lines.

20 Claims, 16 Drawing Sheets

(51) Int. Cl.
 *G02F 1/1345* (2006.01)
 *H01L 27/32* (2006.01)
 *G09G 3/3225* (2016.01)
 *G02F 1/1362* (2006.01)

(52) U.S. Cl.
 CPC .......... *G09G 2330/12* (2013.01); *H01L 21/78* (2013.01); *H01L 27/3276* (2013.01)

(56) References Cited

U.S. PATENT DOCUMENTS

| | | | | |
|---|---|---|---|---|
| 2014/0104251 | A1* | 4/2014 | Zhang | G09G 3/3611 345/205 |
| 2015/0014686 | A1* | 1/2015 | Lv | G09G 3/006 257/48 |
| 2019/0064256 | A1* | 2/2019 | Wang | H01L 27/1262 |

\* cited by examiner

ARRAY SUBSTRATE, MOTHERBOARD OF ARRAY SUBSTRATE, DISPLAY PANEL, AND METHOD FOR FORMING DISPLAY PANEL

CROSS-REFERENCE TO RELATED APPLICATION

This application claims the priority of Chinese Patent Application No. 202011360204.8, filed on Nov. 27, 2020, the content of which is incorporated by reference in its entirety.

TECHNICAL FIELD

The present disclosure generally relates to the field of display technology and, more particularly, relates to an array substrate, a motherboard of an array substrate, a display panel and a method for forming a display panel.

BACKGROUND

In the manufacturing process of a display panel, before the integrated circuit (IC) chip is bonded to the display panel, visual test (VT) is often performed to detect whether the display panel is defective and to prevent defective products from entering the IC bonding process. Therefore, there is a need to set up a desirable detection circuit to perform the VT on the display panel. The disclosed array substrates, motherboards of array substrates, display panels and methods for forming display panels are directed to solve one or more problems set forth above and other problems in the art.

SUMMARY

One aspect of the present disclosure provides an array substrate. The array substrate may include a plurality of sub-pixels, wherein a number N of adjacent sub-pixels of the plurality of sub-pixels form a first pixel unit; a plurality of data lines, extending along a first direction and distributed along a second direction intersecting the first direction, wherein the number X data lines of the number M of columns of sub-pixels of the plurality of sub-pixels form a data line group, $X=M \times N$, $N \geq 3$, N is an integer, and M is a positive integer; a plurality of multiple-channel distribution units, wherein each multiple-channel distribution unit includes number X of first switch elements having a one-to-one correspondence with the number X of data lines, each first switch element includes a first control port, a first input port and a first output port, first input ports of the number X of first switch elements of a same multiple-channel distribution unit are connected together, and first output ports of the number X of first switch elements of the same multiple-channel distribution unit are connected to the number X of data lines of a same date line group with a one-to-one correspondence; a number X of first switch control lines, wherein first control ports of the number X of first switch elements in each multiple-channel distribution unit are connected to the number X of first switch control lines with a one-to-one correspondence; a plurality of test units having a one-to-one correspondence with the plurality of multiple-channel distribution units, each test unit includes N second switch elements, each second switch element includes a second control port, a second input port and a second output port, second input ports of the number N of second switch elements of a same test unit are connected together, and second output ports of second switch elements of the same test unit are electrically connected to first input ports of first switch elements in the same multiple-channel distribution unit; and a number N of second switch control lines, wherein second control ports of the number N of second switch elements of each test unit are connected to the N second switch control lines with a one-to-one correspondence.

Another aspect of the present disclosure provides a motherboard of an array substrate. The motherboard may include a present disclosed array substrate.

Another aspect of the present disclosure provides display panel. The display panel may include a present disclosed array substrate.

Another aspect of the present disclosure provides a method for forming a display panel. The method may include providing an array substrate having a display area and a non-display area located the outer peripheral side of the display area and including a to-be-diced area; and dicing out the to-be-diced area. The array substrate may include a plurality of sub-pixels, wherein a number N of adjacent sub-pixels of the plurality of sub-pixels form a first pixel unit; a plurality of data lines, extending along a first direction and distributed along a second direction intersecting the first direction, wherein the number X data lines of the number M of columns of sub-pixels of the plurality of sub-pixels form a data line group, $X=M \times N$, $N \geq 3$, N is an integer, and M is a positive integer; a plurality of multiple-channel distribution units, wherein each multiple-channel distribution unit includes number X of first switch elements having a one-to-one correspondence with the number X of data lines, each first switch element includes a first control port, a first input port and a first output port, first input ports of the number X of first switch elements of a same multiple-channel distribution unit are connected together, and first output ports of the number X of first switch elements of the same multiple-channel distribution unit are connected to the number X of data lines of a same date line group with a one-to-one correspondence; a number X of first switch control lines, wherein first control ports of the number X of first switch elements in each multiple-channel distribution unit are connected to the number X of first switch control lines with a one-to-one correspondence; a plurality of test units having a one-to-one correspondence with the plurality of multiple-channel distribution units, each test unit includes N second switch elements, each second switch element includes a second control port, a second input port and a second output port, second input ports of the number N of second switch elements of a same test unit are connected together, and second output ports of second switch elements of the same test unit are electrically connected to first input ports of first switch elements in the same multiple-channel distribution unit; and a number N of second switch control lines, wherein second control ports of the number N of second switch elements of each test unit are connected to the N second switch control lines with a one-to-one correspondence.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The features and exemplary embodiments of each aspect of the present disclosure will be described in detail below. To make the objectives, technical solutions, and advantages of the present disclosure clearer, the following further describes the present disclosure in detail with reference to the accompanying drawings and specific embodiments. It should be understood that the specific embodiments described herein are only configured to explain the present disclosure, and are not configured to limit the present disclosure. For those skilled in the art, the present disclosure can be implemented without some of these specific details. The following description of the embodiments is only to provide a better understanding of the present disclosure by showing examples of the present disclosure.

It should be noted that, in this disclosure, relational terms such as first and second are only used to distinguish one entity or operation from another entity or operation, and do not necessarily require or imply one of these entities or operations to have any such actual relationship or order. Moreover, the terms "include", "comprise" or any other variants thereof are intended to cover non-exclusive inclusion such that a process, method, article or device including a series of elements not only includes those elements, but also includes other elements that are not explicitly listed, or also includes elements inherent to this process, method, article or equipment. If there are no more restrictions, the elements defined by the sentence "including" do not exclude the existence of other same elements in the process, method, article, or equipment including the elements.

It should be understood that when describing the structure of a component, when a layer or an area is referred to as being "on" or "above" another layer or another area, it can mean directly on the other layer or area, or it also includes other layers or regions between it and another layer or another region. And, if the component is turned over, the layer or area will be "below" or "below" another layer or area.

The features and exemplary embodiments of various aspects of the present disclosure will be described in detail below. In addition, the features, structures or characteristics described below may be combined in one or more embodiments in any suitable manner.

The present disclosure provides an array substrate, a motherboard of an array substrate, a display panel, and a fabrication method of the display panel. Hereinafter, the array substrate, the motherboard of the array substrate, the display panel and the fabrication method of the display panel according to the embodiments of the present disclosure will be described in detail with reference to the accompanying drawings.

Figure 1:
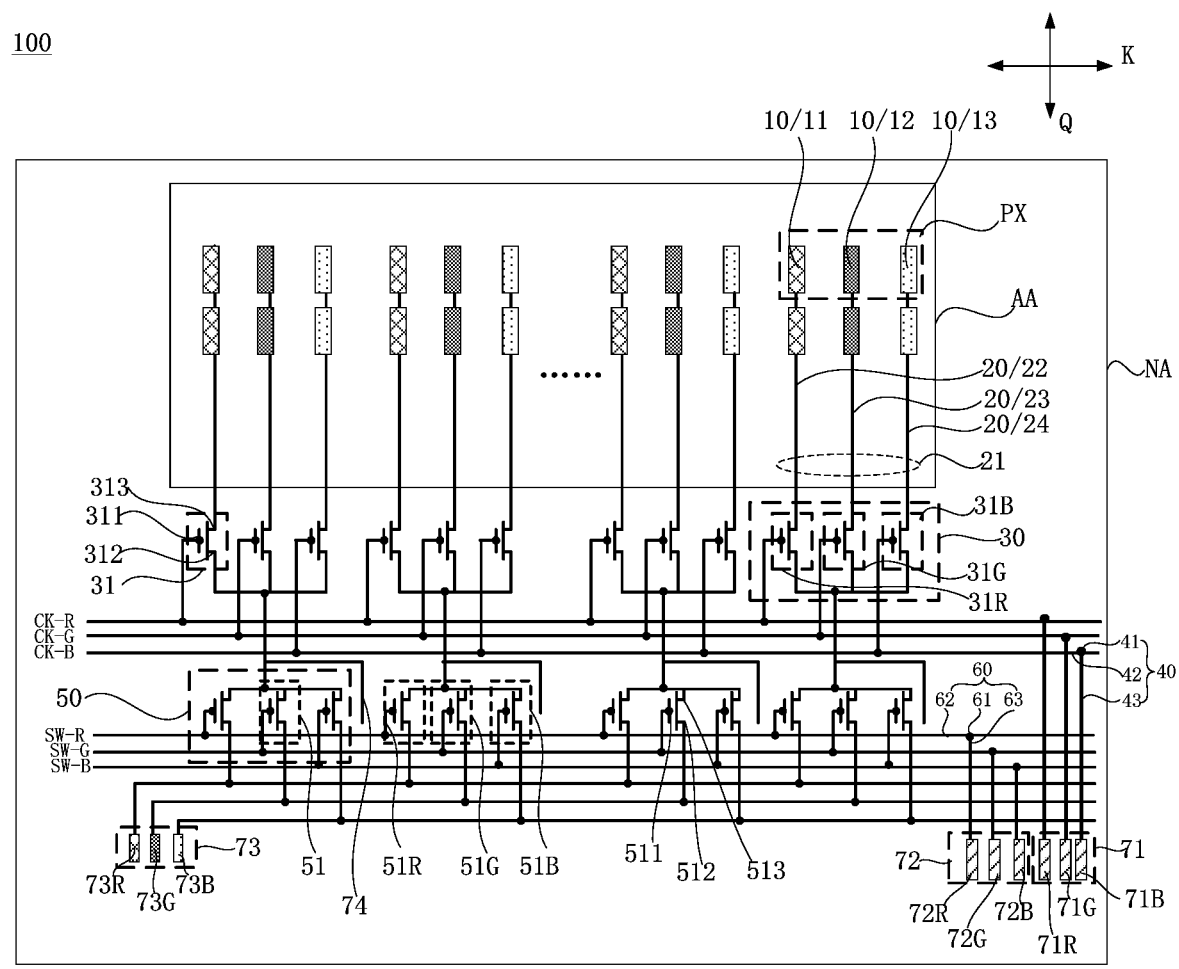
FIG. 1 illustrates an exemplary array substrate consistent with various disclosed embodiments of the present disclosure.
Figure 2:
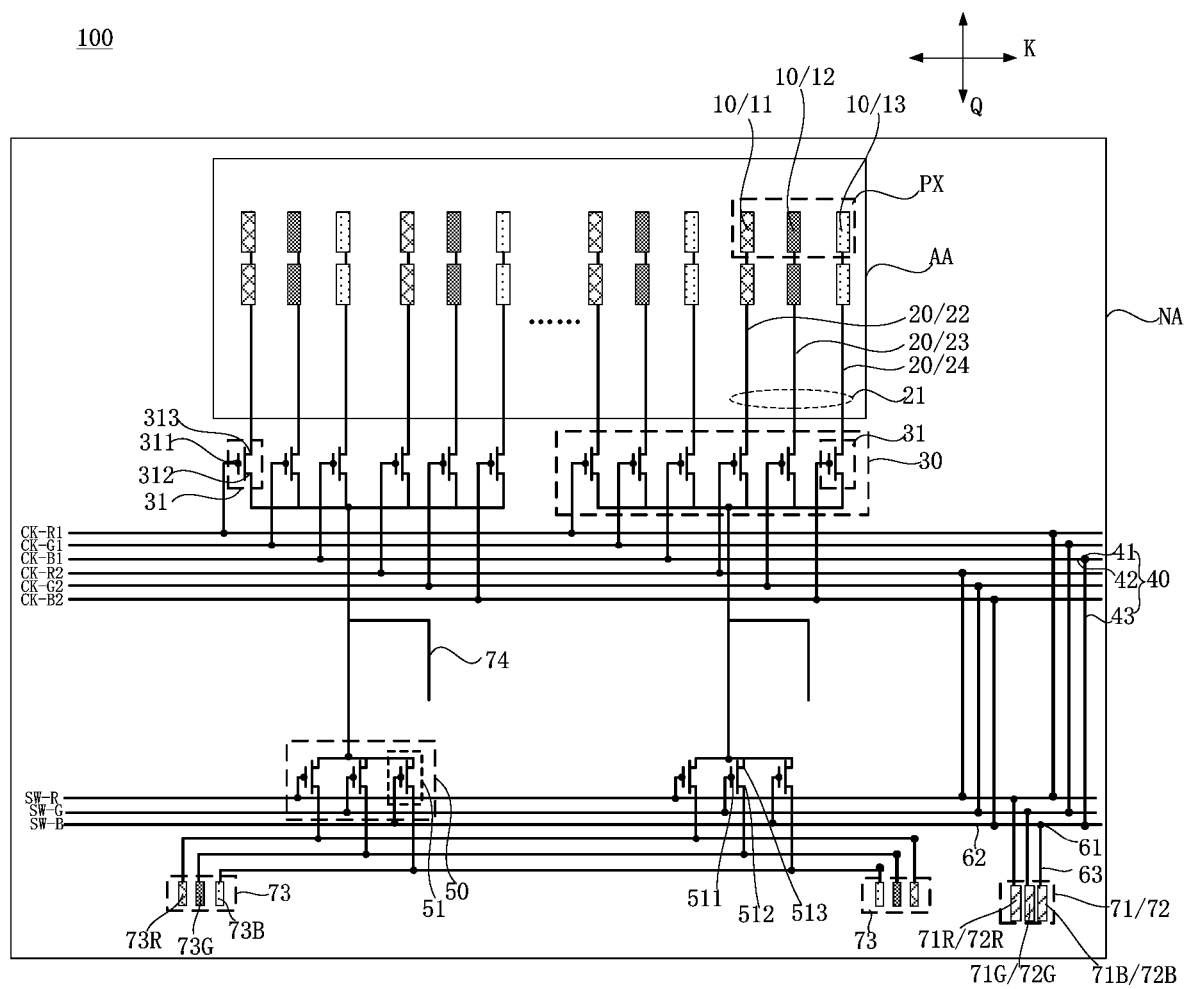
FIG. 2 illustrates another exemplary array substrate consistent with various disclosed embodiments of the present disclosure.
Figure 3:
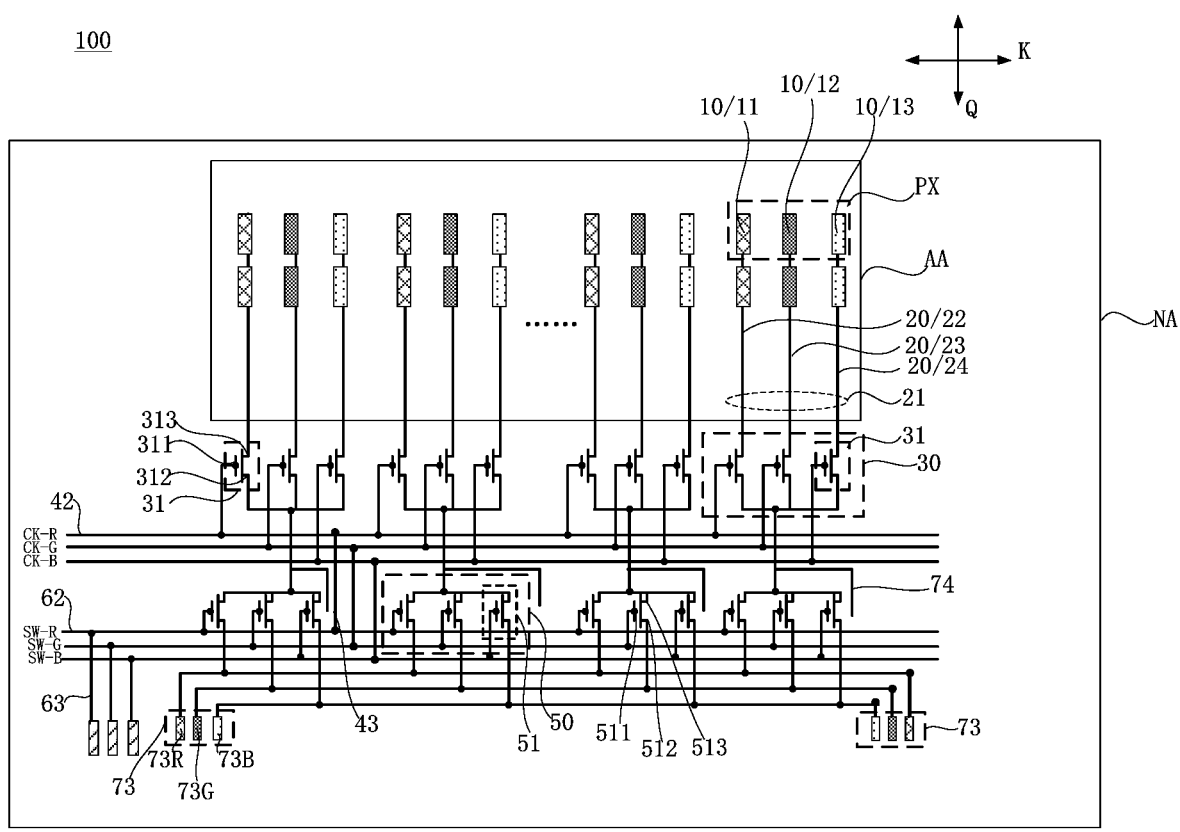
FIG. 3 illustrates another exemplary array substrate consistent with various disclosed embodiments of the present disclosure.

FIG. 1 illustrates a schematic structural diagram of an exemplary array substrate consistent with various disclosed embodiments of the present disclosure. FIG. 2 illustrates a schematic structural diagram of another exemplary array substrate consistent with various disclosed embodiments of the present disclosure. FIG. 3 illustrates a schematic structural diagram of another exemplary array substrate consistent with various disclosed embodiments of the present disclosure.

As shown in FIGS. 1-3, the present disclosure provides an array substrate 100. The array substrate 100 may have a display area AA and a non-display area NA located on the outer peripheral side of the display area AA. The array substrate 100 may include a plurality of sub-pixels 10, a plurality of data lines 20, and a plurality of multiple-channel distribution units 30, a number X of first switch control lines 40, a plurality of test units 50 and a number N of second switch control lines 60. At least a portion (i.e., a certain number) of the plurality of sub-pixels 10 and a least a portion of the plurality of data lines 20 may be located in the display area AA. The plurality of multiple-channel distribution units 30, the X first switch control lines 40, the plurality of test units 50, and the N second switch control lines 60 may all be located in the non-display area NA.

Among the plurality of sub-pixels 10, N adjacent sub-pixels 10 of different colors may form a pixel unit PX. In one embodiment, the plurality of sub-pixels 10 may include a red sub-pixel 11, a green sub-pixel 12, and a blue sub-pixel 13, and three sub-pixels 10 of different colors may form a pixel unit PX. Under such a configuration, N=3. In some embodiments, the plurality of sub-pixels 10 may include a red sub-pixel 11, a green sub-pixel 12, a blue sub-pixel 13, and a white sub-pixel. Four sub-pixels 10 of different colors may form a pixel unit PX. Under such a configuration, N=4. In the present disclosure, patterns filled different colors are used to represent sub-pixels of different colors. The figures schematically illustrate the electrical connection relationship between the data lines and the sub-pixels, and the arrangement of the sub-pixels is not limited.

The plurality of data lines 20 may extend along a first direction Q and may be arranged along a second direction K. The first direction Q and the second direction K may intersect each other. The data lines 20 may be connected to the pixel circuits of the sub-pixels 10 to transmit data signals to the sub-pixels 10; and the pixel circuits may control the sub-pixels 10 to emit light and display. The plurality of sub-pixels 10 may form M columns of pixel units PX. The M columns of pixel units PX may include X data lines 20. The X data lines 20 may form a data line group 21. In one embodiment, X=M×N, N≥3, N is an integer, and M is a positive integer. In specific implementation, the angle between the first direction Q and the second direction K may be 90 degrees, the first direction Q may be the column direction of the array substrate 100, and the second direction K may be the row direction of the array substrate 100. It can be understood that, in FIG. 1, the first direction Q may be the upward and downward extension direction. At this time, the data lines 20 may extend along the upward and downward direction. In one embodiment, the data lines 20 may extend in a straight line along the first direction Q, either a curve extension or a broken line extension, etc., which is not limited by the present disclosure.

Among the plurality of multiple-channel distribution units 30, each multiple-channel distribution unit 30 may include X first switching elements 31 having a one-to-one correspondence with the X data lines 20. Each first switch element 31 may include a first control port 311, a first input port 312 and a first output port 313. The first input ports 312 of the X first switch elements 31 of the same multiple-channel distribution unit 30 may be connected together. The first output ports 313 of the X first switch elements 31 of the same multiple-channel distribution unit 30 may be connected to the X data lines 20 of the same data line group 21 in a one-to-one correspondence. In some embodiments, the first input ports 312 of the X first switch elements 31 of the same multiple-channel unit 30 may be connected to one fanout line 74, and the fanout line 74 may be disposed in the non-display area NA. By arranging the X first switch elements 31 with the X data lines 20 in one multiple-channel distribution unit 30 in a one-one correspondence, each first switch element 31 may independently control the signal transmission of the corresponding data line 20. Further, by connecting the first input ports 312 of the X first switch elements 31 of the same multiple-channel distribution unit 30 to one fanout line 74, the number of wiring of the fanout lines 74 may be reduced and one fanout line 74 may be used to transmit electrical signals to the X data lines 20 to controls the X data lines 20 to emit light. Thus, the number of wirings in the non-display area NA may be reduced, and the area of the non-display area NA may be reduced, and the narrow bezel requirements of the display panel may be realized. The number X of the first switch elements 31 included in each multiple-channel distribution unit 30 may be set according to the number of data lines 20 included in one data line group 21. For example, when one pixel unit PX includes three types of sub-pixels 10 of different colors, the three data lines 20 of a column of pixel units PX may form a data line group 21. That is, the data line group 21 may include three data lines 20. As shown in FIG. 1 and FIG. 3, the number X of the first switch elements 31 included each multiple-channel distribution unit 30 may be 3, or X may be 6 as shown in FIG. 2, and M=2 at this time.

In the X first switch control lines 40, the first control ports 311 of the X first switch elements 31 of each multiple-channel distribution unit 30 may connected to the X first switch control lines 40 in a one-to-one correspondence such that each first switch control line 40 may control the on and off of a corresponding first switch element 31.

The plurality of test units 50 may have a one-to-one correspondence with the plurality of multiple-channel distribution units 30. Each test unit 50 may include N second switch elements 51, and each second switch element 51 may include a second control port 511, a second input port 512, and a second output port 513. The second input ports 512 of the N second switch elements 51 of the same test unit 50 may be connected. The second output ports 513 of the second switch elements 51 in the same test unit 50 may be electrically connected to the first input ports 312 of the first switch elements 31 in the same multiple-channel distribution unit 30. Through such an arrangement, the test signals transmitted by the second switch elements 51 in the test unit 50 may be transmitted to the first switch elements 31 in the same multiple-channel unit 30. Because the first output ports 313 of the first switch elements 31 in the multiple-channel distribution unit 30 may be connected to the X data lines 20 of the same data line group 21 with a one-to-one correspondence, the test signal transmitted by the test unit 50 may be transmitted to the data lines 20 by the multiple-channel distribution unit 30, and the data lines 20 may control the corresponding sub-pixels 10 to emit light and display.

Among the N second switch control lines 60, the second control ports 511 of the N second switch elements 51 of each test unit 50 may be connected to the N second switch control lines 60 in a one-to-one correspondence such that each second switch control line 60 may be able to control the on and off of a corresponding second switch element 51.

According to the array substrate 100 of the embodiment of the present disclosure, the second switch control line 60 may be configured to control the on and off of the second switch element 51 of the test unit 50, and the first switch control line 40 may be configured to control the first switch element 31 of the multiple-channel distribution unit 30. When the first switch element 31 and the corresponding second switch element 51 are at the on state, the test signal in the array substrate 100 of the embodiment of the present disclosure may be transmitted to the first input port 312 of the first switch element 31 through the second output port 513 of the second switch element 51, and then transmitted from the first output port 313 of the first switch element 31 to the corresponding data line 20, thereby controlling the light-emitting display of the sub-pixel 10 electrically connected to the data line 20. When the array substrate 100 is applied to a display panel, the VT of the display panel may be realized.

In some embodiments, the X first switch control lines 40 may include a first sub-switch control line CK-R, and the first sub-switch control line CK-R may include a first sub-line portion 42 and a first sub-inlet portion 43 connected to a first node 41. The extension direction of the first sub-line portion 42 may intersect the first direction Q, and the extension direction of the first sub-inlet portion 43 may intersect the second direction K. The N second switch control lines 60 may include a second sub-switch control line SW-R, and the second sub-switch control line SW-R may include a second sub-line portion 62 and a second sub-inlet portion 63 connected to a second node 61. The extension direction of the second sub-line portion 62 may intersect the first direction Q, and the extension direction of the second sub-inlet portion 63 may intersect the second direction K. The array substrate 100 may further include a first control terminal 71, a second control terminal 72 and a signal terminal 73. The first control terminal 71 may be electrically connected to the first sub-inlet portion 43; the second control terminal 72 and the second sub-line inlet portion 63 may be electrically connected to each other. The signal terminal 73 may be electrically connected to the second input terminal 512 of the second switch element 51.

In one embodiment, both the first sub-switch control line CK-R and the second sub-switch control line SW-R may be used to control the signal transmission of the data lines 20 corresponding to the sub-pixels 10 of the same color. For example, the first sub-switch control line CK-R and the second sub-switch control line SW-R may be both used to control the signal transmission of the data line 20 of the red sub-pixel 11. At this time, when the first sub-switch control line CK-R controls the first switch element 31 to be turned on, the second sub-switch control line SW-R may control the second switch element 51 to be turned on, the electrical signal transmitted by the signal terminal 73 may control the sub-pixels 10 of the same color to emit light through the second switch element 51 and the first switch element 31. Thus, a pure color screen display during the VT may be achieved. At the same time, because the second switch element 51 may control the sub-pixels 10 to emit light through the first switch element 31, it may be possible to avoid setting the connection leads of the second switch element 51 and the data line 20 separately; and the width of the array substrate 100 may be reduced. In the first sub-switch control line CK-R and the second sub-switch control line SW-R that control the signal transmission of the corresponding to the data line 20 of the sub-pixels 10 of the same color, the sub-line portion 42 of the first sub-switch control line CK-R may be located at a first side of the first node 41, and the number of the first switching elements 31 connected to the first sub-line portion 42 may be p1. The second sub-line portion 62 of the second sub-switch control line SW-R may be located at a first side of the second node 61, the number of second switch elements 51 connected to the second sub-line portion 62 may be q1, and p1 and q1 may satisfy the relationship: $|p1-q1| \leq k$, $p1 \geq 0$ and p1 is an integer, q1 and is an integer, and k is a preset threshold. The preset threshold is the maximum value of $|p1-q1|$ when the display effect of the display panel visually seen by the user is uniform, and there is no vertical display unevenness (mura), such as bright and dark lines. Through the above arrangement, the first node 41 and the second node 61 may be adjacent to each other along the second direction K, and the issues of the vertical display unevenness (mura) may be improved. When the distance between the first node 41 and the second node 61 is too large along the second direction K, because the off-signal transmitted by the line CK-R and the off-signal transmitted by the second sub-switch control line SW-R may have a time delay during transmission, when the off-signal in the second sub-switch control line SW-R is transmitted to one of the second switch element 51, the first switch element 31 electrically connected to the second output port 513 of the second switching element 51 may have not received the off signal, and may be still at the on-state. Thus, the voltage coupling amount of the data line 20 that is electrically connected to the first switch element 31 is inconsistent with the voltage coupling amount of other data lines 20. Thus, the display panel may have the vertical display unevenness (mura). For example, as shown in FIG. 1, the first node 41 and the second node 61 of the embodiment of the present disclosure are adjacent to each other, the time for the off-signal sent out from the second control terminal 72 and transmitted to each second switch element 51 through the second node 61 along the second sub-lines 62 may be similar as the time for the off-signal sent from the first control terminal end 71 and transmitted through the first node 41 along the first sub-line portion 42 to each first switch element 31. Thus, the voltage coupling amount of the data lines 20 at different positions electrically connected to the first switch element 31 may be similar such that the display effect of the display panel may be uniform. It can be understood that the first side may be one side of the extension direction of the second sub-line portion 62. As shown in FIGS. 1-3, the second sub-line portion 62 extends in the left-right direction in the drawings, then the first side may be the left or right side of the second sub-line portion 62, for example, the first side may be the right side of the second sub-line portion 62, that is, the second node 61 may located on the right side of the second sub-line portion 62. At this time, the first node 41 may be located at the right side of the first sub-line portion 42. In another embodiment, the first side may be the left side of the second sub-line portion 62. For example, the second node 61 may be located at the left side of the second sub-line portion 62. At this time, the first node 41 may be located at the left side of the first sub-line portion 42.

In one embodiment, as shown in FIG. 1, the number of first switch elements 31 included in each multiple-channel distribution unit 30 is X=3, and the number of second switch elements 51 included in each test unit 50 is N=3. The first node 41 may be located at the right side of the first sub-line portion 42, and the second node 61 may be located at the right side of the second sub-line portion 62. At this time, p1=q1, then p1 and q1 satisfy the relationship: $|p1-q1|=0$. As shown in FIG. 2, the number of first switch elements 31 included in each multiple-channel distribution unit 30 is X=6, and the number of second switch elements 51 included in each test unit 50 is N=3. The first node 41 may be located at the right side of the first sub-line portion 42, and the second node 61 may be located at the right side of the second sub-line portion 62. Using the first sub-switch control line CK-R1 and the second sub-switch control line SW-R corresponding to the signal transmission of the data line 22 of the red sub-pixel 11 as an example, at this time, p1 and q1 may satisfy the relationship: $|p1-q1|=0$. In the structure of the array substrate 100 shown in FIG. 1 and FIG. 2, along the second direction K, all of the first switch elements 31 may be located at the left side of the first node 41, and all of second switch elements 51 may be located at the left side of the second node 61. Such a configuration may allow the time for the off-signal sent from the second control terminal 72 to be transmitted to each second switch element 51 through the second node 61 along the second sub-line 62 to be substantially same as the time for the off-signal sent from the first control terminal 71 to be transmitted to each first switch element 31 through the first node 41 along the first sub-line portion 42. Thus, the delay between the off-signals received by the first switch element 31 and the second switch element 51 electrically connected to the first switch element 31 may be reduced; and the voltage coupling amounts of the data lines 20 at different positions electrically connected to the first switch elements 31 may be similar. Accordingly, the display uniformity of the display panel may be improved.

In some embodiments, when the array substrate 100 includes N signal terminals 73, in a same pixel unit PX, the N data lines 20 respectively connected to the N sub-pixels 10 of different colors may be electrically connected to the N signal terminals in a one-to-one correspondence through the different first switch elements 31 and second switch elements 51. Through such a configuration, different signal terminals 73 may transmit data signals to different data lines 20 to control the light-emitting display of the sub-pixels 10 of different colors; and the VT may be realized.

The specific structure of the test unit 50 that can realize the light-emitting display of the sub-pixels 10 of different colors may be introduced below with reference to FIG. 1. Referring to FIG. 1, one pixel unit PX may include three sub-pixels 10: a red sub-pixel 11, a green sub-pixel 12, and a blue sub-pixel 13. The multiple data lines 20 may include a first data line 22 for transmitting data signals to the red sub-pixel 11, a second data line 23 for transmitting data signals to the green sub-pixel 12 and a third data line 24 for transmitting data signals to the blue sub-pixel 13. The multiple-channel distribution unit 30 may include three first switch elements 31: a first switch element 31R, the first switch element 31G, and the first switch element 31B. The X first switching control lines 40 may also include a third sub-switch control line CK-G and a fourth sub-switch control line CK-B. Each of the first sub-switch control line CK-R, the third sub-switch control line CK-G, and the fourth sub-switch control line CK-B may include a first sub-line portion 42 connected to the first node 41 and a first sub-inlet portion 43 connected to the first node 41. Each test unit 50 may include three second switch elements 51, which are respectively the second switch element 51R, the second switch element 51G, and the second switch element 51B. N second switch control lines 60 may also include a fifth sub-switch control line SW-G and a sixth sub-switch control line SW-B. The signal terminals 73 may include a first signal terminal 73R, a second signal terminal 73G, and a third signal terminal 73B.

The first sub-switch control line CK-R may be electrically connected to the control terminal port 511 of the second switch element 51R. The second sub-switch control line SW-R may be electrically connected to the control port 311 of the first switch element 31R. The first signal terminal 73R may be electrically connected to the second input port 512 of the second switch element 51R. The second output port 513 of the second switch element 51R may be electrically connected to the first input port 312 of the first switch element 31R. The first output port 313 of the first switch element 31R may be connected to the first data line 22. The first data line 22 may be configured to transmit data signals to the red sub-pixel 11. Through such an arrangement, when the first sub-switch control line CK-R turns on the first switch element 31R and the second sub-switch control line SW-R turns on the second switch element 51R, the electrical signal input in the signal terminal 73R may control the red sub-pixel 11 to emit light through the second switch element 51R and the first switch element 31R. Similarly, the third sub-switch control line CK-G may be electrically connected to the control port 511 of the second switch element 51G; the third sub-switch control line SW-G may be electrically connected to the control port 311 of the first switching element 31G; and the first signal port 73G may be electrically connected to the second input port 512 of the second switch element 51G; the second output port 513 of the second switch element 51G may be electrically connected to the first input port 312 of the first switch element 31G; and the first output port 313 of the first switching element 31G may be connected to the second data line 23. The second data line 23 may be configured to transmit data signals to the green sub-pixel 12. Through such a configuration, when the third sub-switch control line CK-G selects to turn on the first switch element 31G and the fifth sub-switch control line SW-G selects to turn one the second switch element 51G, the electrical signal input into the signal terminal 73G may control the green sub-pixel 12 to emit light through the second switch element 51G and the first switch element 31G. The fourth sub-switch control line CK-B may be electrically connected to the control port 511 of the second switch element 51B; the sixth sub-switch control line SW-B may be electrically connected to the first control port 311 of the first switch element 31B; the first signal terminal 73B may be electrically connected to the second input port 512 of the second switch element 51B; the second output port 513 of the second switch element 51B may be electrically connected to the first input port 312 of the first switch element 31B; and the first output port 313 of the first switch element 31B may be connected to the third data line 24. The third data line 24 may be used to transmit data signals to the blue sub-pixel 13. Through such a configuration, when the fourth sub-switch control line CK-B may be configure to selects to turn on the first switch element 31B and the sixth sub-switch control line SW-B selects to turn on the second switching element 51B, the electrical signal input into the signal terminal 73B may control the blue sub-pixel 13 to emit light through the second switch element 51B and the first switch element 31B.

The number of first switch elements 31 electrically connected to the first sub-line portion 42 of the first sub-switch control line CK-R may be p1. The number of the second switch elements 51 electrically connected to the second sub-line portion 62 of the second sub-switch control line SW-R may be q1, and |p1−q1|≤k. The number of first switch elements 31 connected to the first sub-line portion 42 of the third sub-switch control line CK-G may be p1. The number of second switch elements 51 electrically connected to the second sub-line portion 62 of the fifth sub-switch control line SW-G is q1, and |p1−q1|≤k. The number of first switch elements 31 electrically connected to the first sub-line portion 42 of the fourth sub-switch control line CK-B may be p1. The number of second switch elements 51 electrically connected to the second sub-line portion 62 of the sixth sub-switch control line SW-B may be q1, and |p1−q1|≤k.

The X first switch control lines 40 in FIG. 2 may include a first sub-switch control line CK-R1, a first sub-switch control line CK-R2, a third sub-switch control line CK-G1, a third sub-switch control line CK-G2, a fourth sub-switch control line CK-B1, a fourth sub-switch control line CK-B2. The first sub-switch control line CK-R1, the first sub-switch control line CK-R2 and the second sub-switch control lines SW-G may all be configured to control the signal transmission of the data line 22 corresponding to the red sub-pixel 11. The third sub-switch control line CK-G1, the third sub-switch control line CK-G2, and the fifth sub-switch control line SW-G may all be configured to control the signal transmission of the data line 23 corresponding to the green sub-pixel 12. The fourth sub-switch control line CK-B1, the fourth sub-switch control line CK-B2, and the sixth sub-switch control line SW-B may all be used to control the signal transmission of the data line 24 corresponding to the blue sub-pixel 13. The connection mode of the test units 50, the multiple-channel distribution units 30, and the data lines 20 may be similar to that of FIG. 1.

Figure 4:
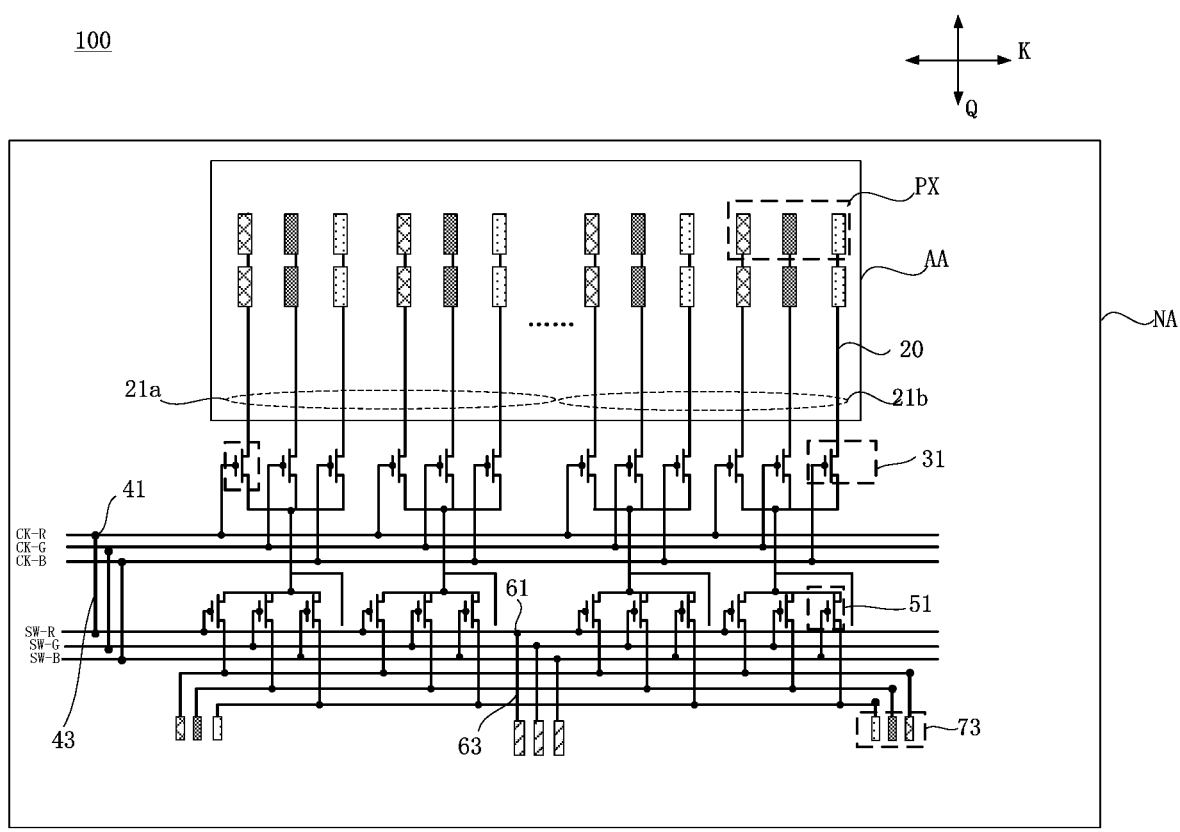
FIG. 4 illustrates another exemplary array substrate consistent with various disclosed embodiments of the present disclosure.

FIG. 4 is a schematic structural diagram of another exemplary array substrate consistent with various disclosed embodiments of the present disclosure. As shown in FIG. 4, in the array substrate 100, a plurality of data lines 20 may form a first data line group 21a and a second data line group 21b. The number of the data lines 20 included in the first data line group 21a and the number of the data lines 20 included in the second data line group 21b may be same. Along the second direction K, the first sub-inlet 43 and the first node 41 may be located at the side of the first data line group 21a away from the second data line group 21b. For example, the first node 41 may be located on the edge of the array substrate 100. The second sub-inlet 63 and the second node 61 may be located between the first data line group 21 and the second data line group 21 b. For example, the second sub-inlet 63 and the second node 61 may be located in the middle of the array substrate 100. Through such a configuration, the test signal can be transmitted to the data lines 20 through the second switch element 51 and the first switch elements 31; and the VT test of the display panel may be realized.

Figure 5:
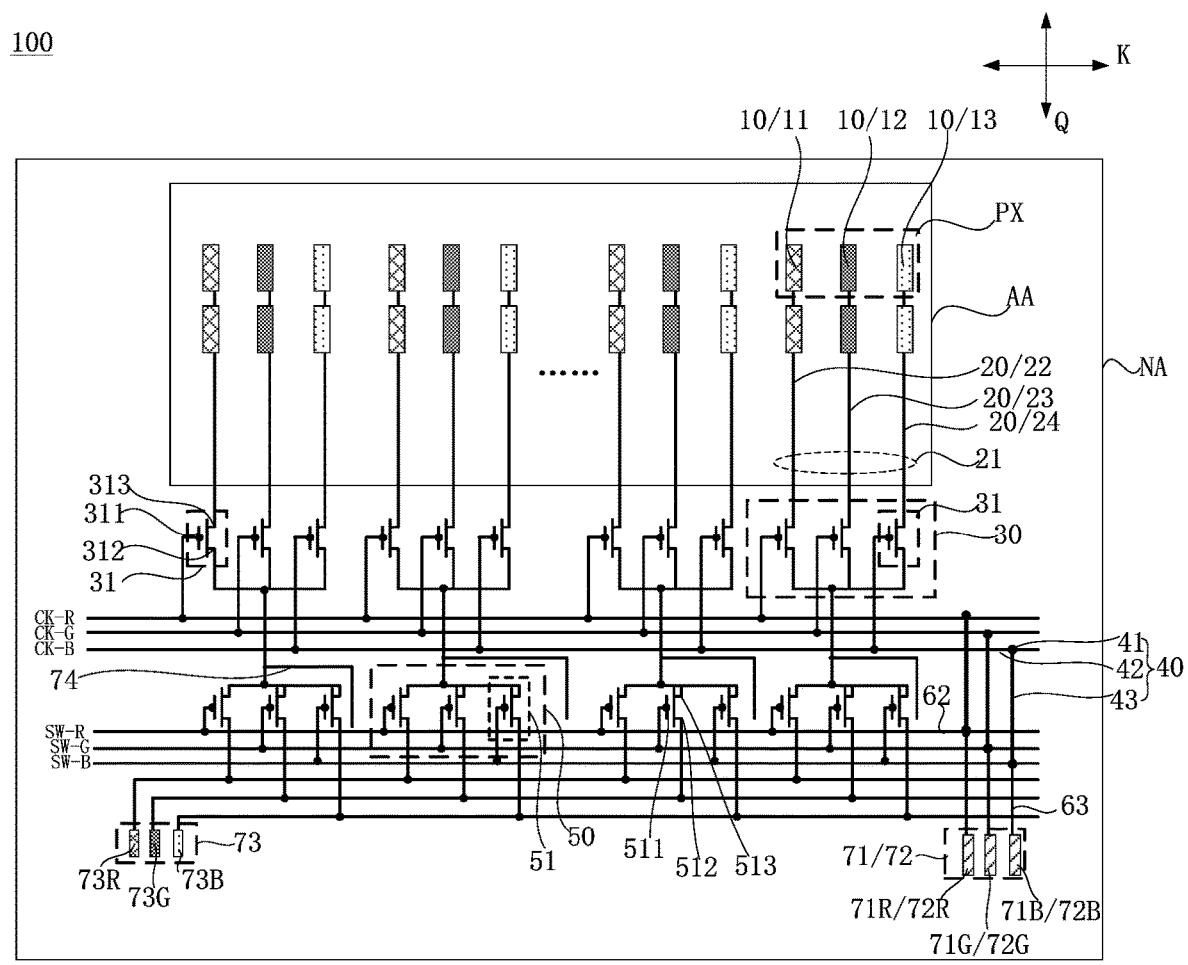
FIG. 5 illustrates another exemplary array substrate consistent with various disclosed embodiments of the present disclosure.
Figure 6:
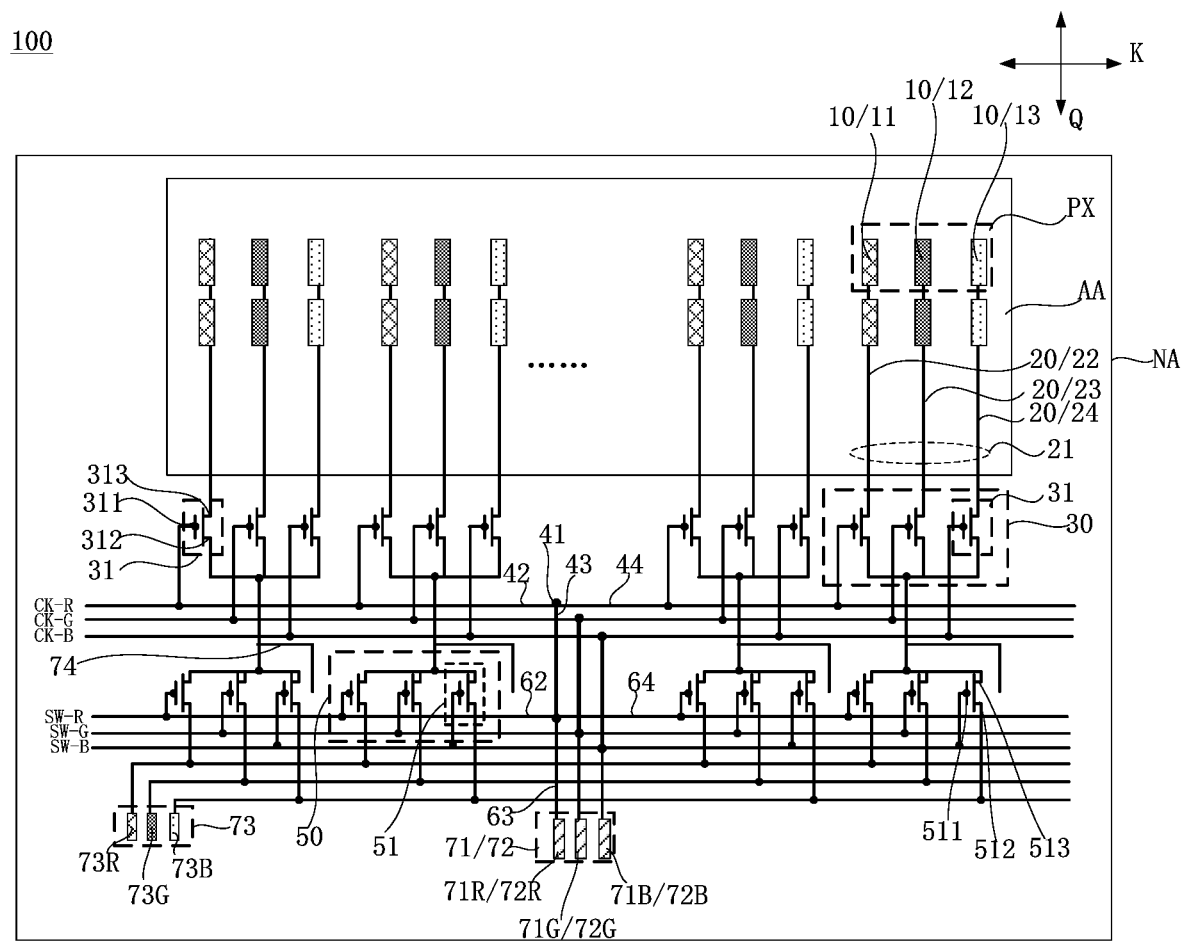
FIG. 6 illustrates another exemplary array substrate consistent with various disclosed embodiments of the present disclosure.
Figure 7:
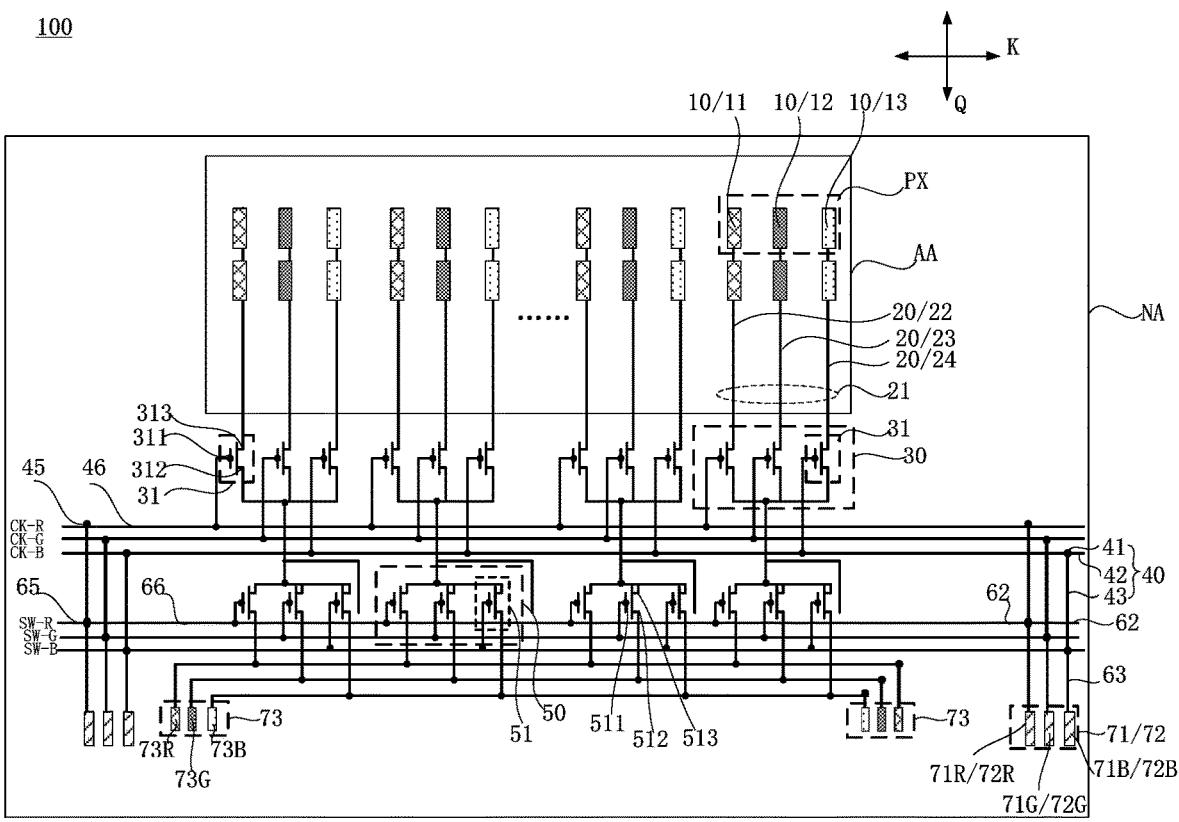
FIG. 7 illustrates another exemplary array substrate consistent with various disclosed embodiments of the present disclosure.

FIG. 5 is a schematic structural diagram of another exemplary array substrate consistent with various disclosed embodiments of the present disclosure, FIG. 6 is a schematic structural diagram of another exemplary array substrate consistent with various disclosed embodiments of the present disclosure, and FIG. 7 another exemplary array substrate consistent with various disclosed embodiments of the present disclosure. As shown in FIG. 2 and FIGS. 5-7. In some embodiments, the second control terminal 72 may be multiplexed as the first control terminal 71. In the first sub-switch control line CK-R and the second sub-switch control line CK-R that control the signal transmission of the data line 20 corresponding to the sub-pixels 10 of the same color, the first sub-inlet portion 43 and the second sub-inlet portion 63 may be electrically connected. It can be understood that when the first switch control line 40 further includes a third sub-switch control line CK-G, and the second switch control line 60 further includes a fifth sub-switch control line SW-G, the first sub-inlet portion 43 of the third sub-switch control line CK-G may be electrically connected to the second sub-inlet portion 63 of the fifth sub-switch control line SW-G. Through the above configuration, the number of arrangements of the control terminals may be reduced, and the arrangement of the control terminals on the array substrate 100 may be optimized. Thus, the arrangement of the control terminals on the array substrate 100 may be more reasonable and standardized.

Referring to FIG. 5 and FIG. 6, in some embodiments, p1=q1>0, and k=0. In the above configuration, the first node 41 and the second node 61 may be arranged to be adjacent to each other such that the time for the off-signal sent from the second control terminal 72 to be transmitted to each second switch element 51 through the second node 61 along the second sub-line portion 62 may be substantially same as the time for the off-signal sent from the first control terminal 71 to be transmitted to each first switch element 31 through the first node 41 along the first sub-line portion 42. Thus, the time delay between the off-signal received by the first switch element 31 and the off-signal received by the second switch element 51 may be reduced, and the voltage coupling amount of the data lines 20 at different positions electrically connected to the first switch elements 31 may be similar. Accordingly, the display uniformity of the display panel may be improved. In one embodiment, as shown in FIG. 7, the first node 41 may be located at the left side of the first sub-line portion 42, and the second node 61 may be located at the left side of the second sub-line portion 62. At this time, p1=q1=0, and k=0.

To reasonably arrange the positions of the first node 41 and the second node 61, in some embodiments, the first sub-switch control line CK-R may further include a third sub-line portion 44 whose extension direction intersects the first direction Q, and the third sub-line portion 44 and the first sub-line portion 42 may be connected to the first node 41. The second sub-switch control line SW-R may also include a fourth sub-line portion 64 whose extension direction may cross the first direction Q, and the fourth sub-line portion 64 and the second sub-line portion 62 may be connected to the second node 61. The third sub-line portion 44 may be located at the second side of the first node 41, and the number of the first switch elements 31 connected to the third sub-line portion 44 may be p2. The fourth sub-line portion 64 may be located at the second side of the second node 61, and the number of the second switch elements 51 connected to the fourth sub-line portion 64 may be q2. p2 may be a positive integer, q2 may be a positive integer, and the first side may be different from the second side. It is understandable that the second side may be one side of the extension direction of the third sub-line portion 44. As shown in FIG. 6, the third sub-line portion 44 may extend along the left and right direction in FIG. 6, and the second side may be one of the left or the right side of the third sub-line portion 44. Similarly, the fourth sub-line portion 64 may extend along the left or the right direction in FIG. 6, and the second side may be one of the left side or the right side of the fourth sub-line portion 64. Because the first side and the second side may be different, the first side may be one of the left side or the right side in FIG. 6, and the second side may be the other of the left side and the right side. For example, the first node 41 may be located at the right side of the first sub-line portion 42, the first node 41 may be located at the left side of the third sub-line portion 44, the second node 61 may be located at the right side of the second sub-line portion 62, and the second node 61 may be located at the left side of the fourth sub-line portion 64.

In some embodiments, p1=p2, q1=q2, and k=0. At this time, the first node 41 and the second node 42 may be located in the middle of the array substrate 100, which may be simplify the manufacturing process of the array substrate 100.

To facilitate a standard wiring, in one embodiment, the first sub-inlet portion 43 and the second sub-inlet portion 63 may also extend along the first direction Q. The third sub-line portion 44 and the fourth sub-line portion 64 may both extend along the second direction K.

FIG. 7 is a schematic structural diagram of another exemplary array substrate consistent with various disclosed embodiments of the present disclosure. As show in FIG. 7, to make the voltage difference of the data lines 21 written into the display area AA smaller, in some embodiments, the first sub-switch control line CK-R may further include at least one third node 45 and a first sub-connection line portion 46 connecting the first node 41 and the third node 45. The number of the first switch elements 31 connected to the first sub-line portion 46 may be p3. The second sub-switch control line SW-R may also include at least one fourth node 65 and a second sub-connection line 66 connecting the second node 61 and the fourth node 65. The number of first switch elements 31 connected to the second sub-connection line portion 66 may be q3. p3 may be a positive integer, and q3 may be a positive integer.

As shown in FIG. 7, the first sub-switch control line CK-R may further include the third node 45, and the second sub-switch control line SW-R may further include the fourth node 65. For example, at this time, the first sub-inlet portion 43 and the second sub-inlet portion 63 may respectively feed in wires from two sides of the array substrate 100 along the second direction K, and control terminals may be respectively provided at both sides.

Figure 8:
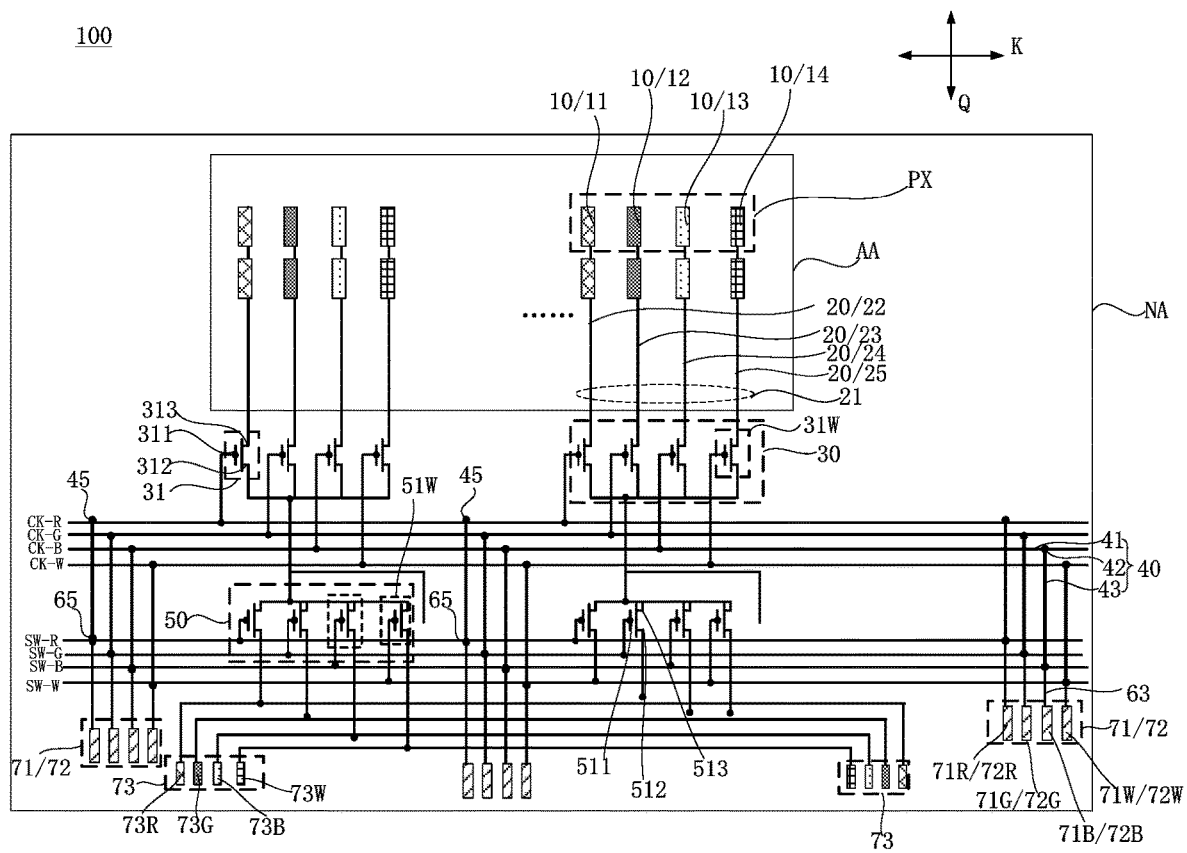
FIG. 8 illustrates another exemplary array substrate consistent with various disclosed embodiments of the present disclosure.

FIG. 8 is a schematic structural diagram of another exemplary array substrate consistent with various disclosed embodiments of the present disclosure. As shown in FIG. 8, in the array substrate 100, the number of the third node 45 and the number of the fourth node 65 may be two, respectively, such that the first sub-switch control line CK-R and each second sub-switch control line SW-R may have multiple inlet nodes. Such a configuration may effectively reduce the wiring load, and the difference of the voltage written by each data line 21 in the display area AA may be substantially small. Accordingly, the display effect of the display panel may be uniform. The positional relationship between the third node 45 and the fourth node 65 may be same as the positional relationship between the first node 41 and the second node 61. The number and position of the inlet nodes on the third sub-switch control line CK-G and the fourth sub-switch control line CK-B may be similar to those of the first sub-switch control line CK-R in the previous embodiments, and the number and the position of inlet nodes on the fifth sub-switch control line SW-G and the sixth sub-switch control line SW-B may be similar to those of the second sub-switch control line SW-R in the previous embodiments, and will not be repeated here.

Referring to FIG. 8, the plurality of sub-pixels 10 may include a red sub-pixel 11, a green sub-pixel 12, a blue sub-pixel 13, and a white sub-pixel 14. Four sub-pixels 10 of different colors may form a pixel unit PX; and N=4. Correspondingly, M may be 1, then X=4. For example, each multiple-channel distribution unit 30 may include four first switch elements 31; and each test unit 50 may include four second switch elements 51. The number of the first control the terminals 71, the second control terminals 72, and the signal terminals 73 may be four, respectively.

In a specific implementation, the X first switch control lines 40 may also include a seventh sub-switch control line CK-W, and the N second switch control lines 60 may also include an eighth sub-switch control line SW-W. The signal terminal 73W may be electrically connected to the second input port 512 of the second switch element 51W. The second output port 513 of the second switch element 51W may be electrically connected to the first input port 312 of the first switch element 31W, and the control port 511 of the second switch element 51W may be electrically connected to the second sub-control line SW-W, the first output port 313 of the first switch element 31W may be electrically connected to the data line 25 that transmits data signals to the white sub-pixel 14, and the first control port 311 of the first switch element 31W may be electrically connected to the first sub-control line CK-W, and the sub-pixels of other colors may be electrically connected to each switch element in a similar manner.

Figure 9:
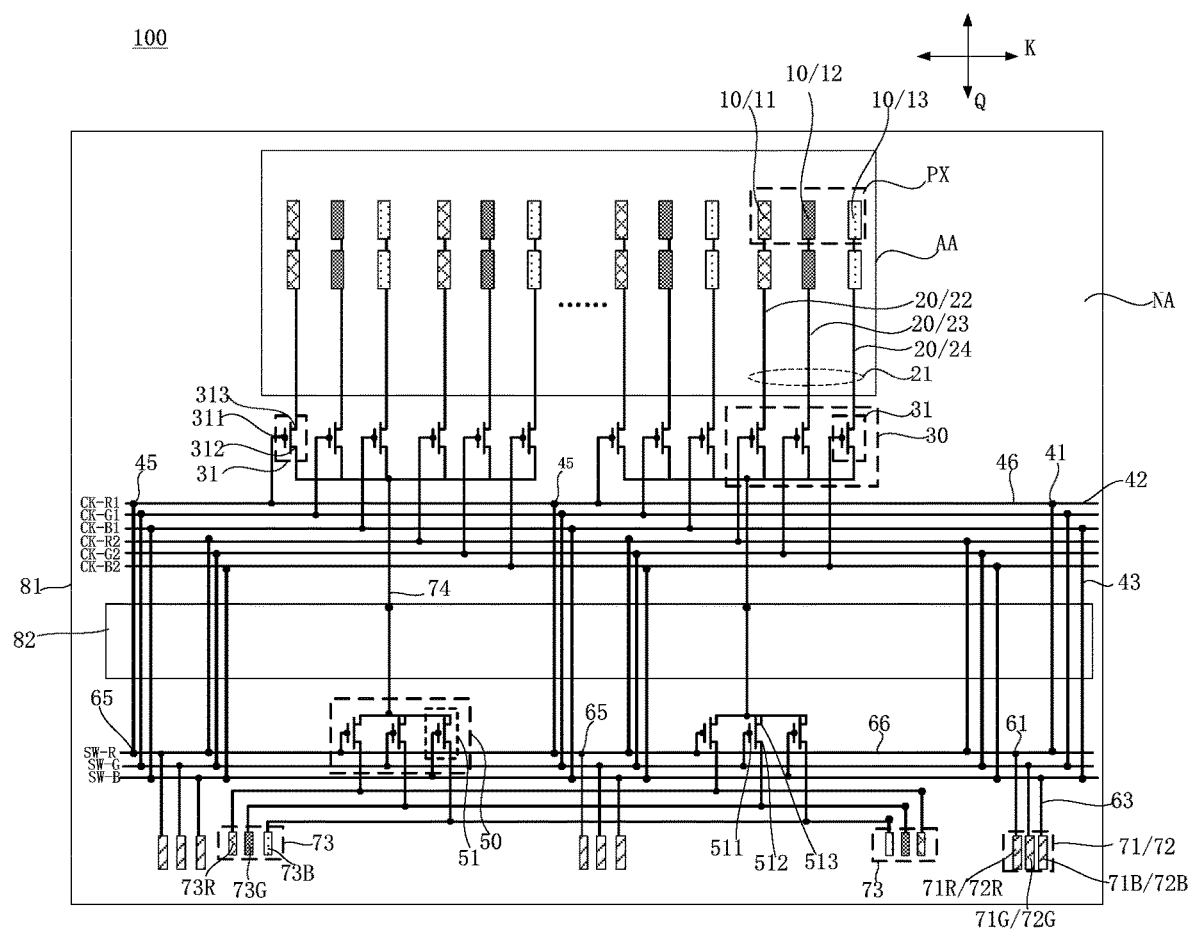
FIG. 9 illustrates another exemplary array substrate consistent with various disclosed embodiments of the present disclosure.
Figure 10:
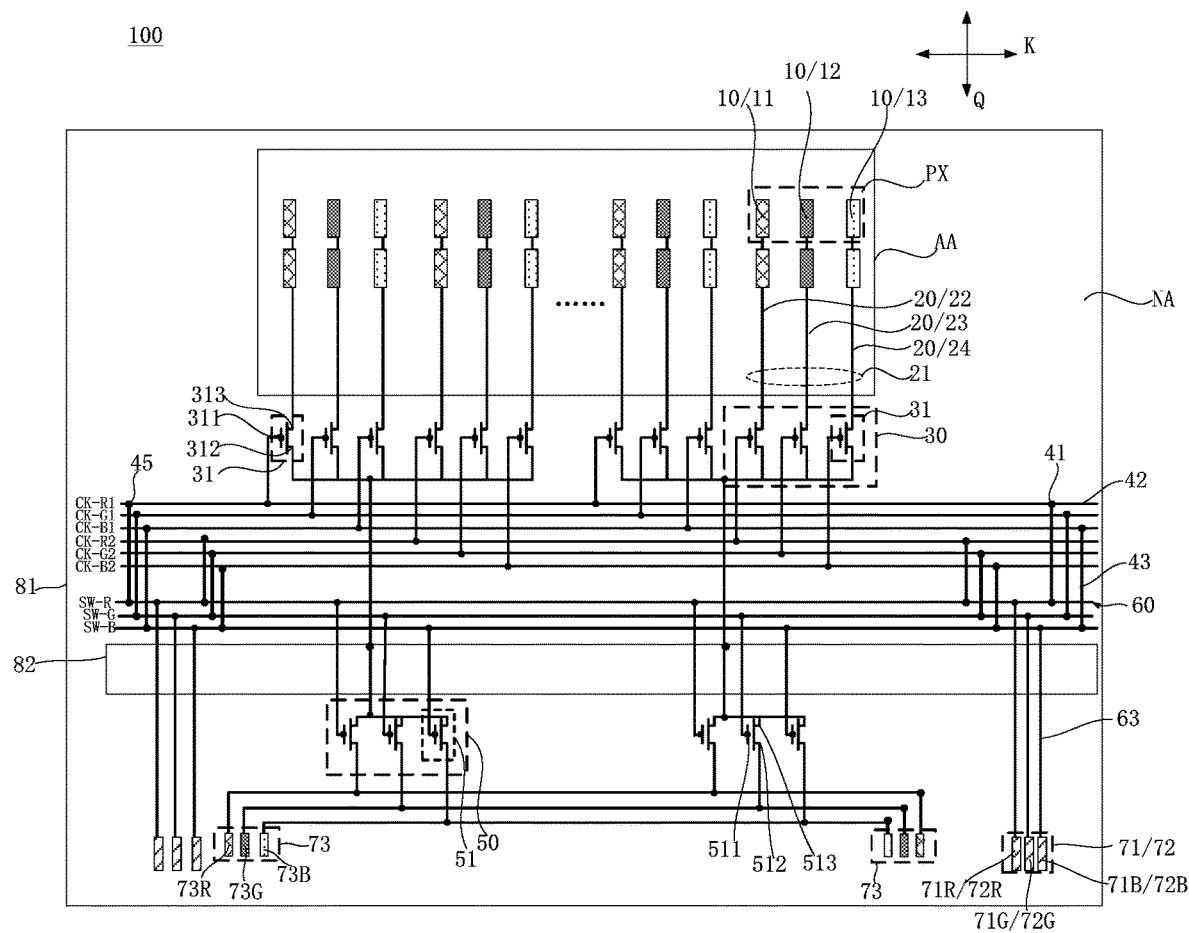
FIG. 10 illustrates another exemplary array substrate consistent with various disclosed embodiments of the present disclosure.
Figure 11:
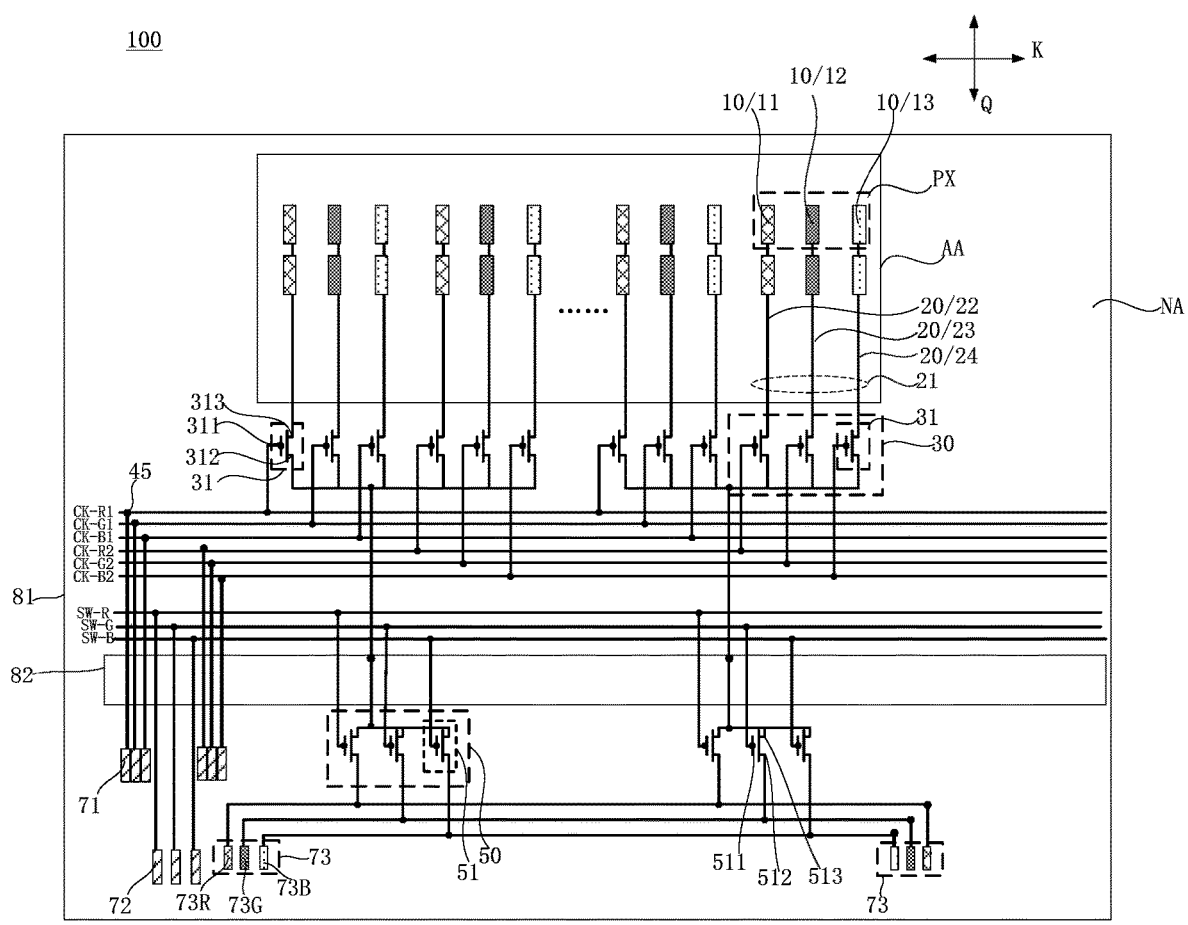
FIG. 11 illustrates another exemplary array substrate consistent with various disclosed embodiments of the present disclosure.

FIG. 9 is a schematic structural diagram of another exemplary array substrate consistent with various disclosed embodiments of the present disclosure. FIG. 10 is a schematic structural diagram of another exemplary array substrate consistent with various disclosed embodiment of the present disclosure. FIG. 11 is a schematic structural diagram of another exemplary array substrate consistent with various disclosed embodiment of the present disclosure. As shown in FIGS. 9-11, in some embodiments, the array substrate 100 may include a substrate 81 and an integrated circuit bonding area 82 on the substrate 81. The integrated circuit bonding area 82 may be used for bonding IC chips, and each multiple-channel distribution unit 30 may be electrically connected to the leads on the IC chip through a fanout line 74 to cause the IC chip to control the light-emitting display of each sub-pixel 10. Along the first direction Q, the integrated circuit bonding area 82 may be located between the multiple-channel distribution unit 30 and the testing unit 50. Along a direction perpendicular to the plane where the substrate 81 is located, the first sub-inlet portion 43 and the integrated circuit bonding area 82 may at least partially overlap, and/or the second sub-inlet portion 63 and the integrated circuit bonding area 82 may at least partially overlap. Through such a configuration, the position of the test unit 50 may be reasonably arranged on the array substrate 100 to stably realize the VT of the display panel. At the same time, the IC chip bonded on the integrated circuit bonding area 82 may be connected to the data lines 20 through the multiple-channel distribution unit 30, or the multiple-channel distribution unit 30 and the test unit 50 to realize the control function of the IC chip on the display of the sub-pixels 10.

In a specific implementation, as shown in FIG. 9, along a direction perpendicular to the plane where the substrate 81 is located, the first sub-inlet portion 43 and the integrated circuit bonding area 82 may at least partially overlap. In another embodiment, as shown in FIG. 10, the second switch control line 60 may be located at the side of the test unit 50 adjacent to the display area AA. Along a direction perpendicular to the plane where the substrate 81 is located, the second sub-inlet portion 63 may at least partially overlap the integrated circuit bonding area 82. In another embodiment, as shown in FIG. 11, when the first control terminal 71 and the second control terminal 72 are not multiplexed each other, along the direction perpendicular to the plane where the substrate 81 is located, the first sub-inlet portion 43 and the integrated circuit bonding area 82 may at least partially overlap, and the second sub-inlet portion 63 and the integrated circuit bonding area 82 may at least partially overlap.

Figure 12:
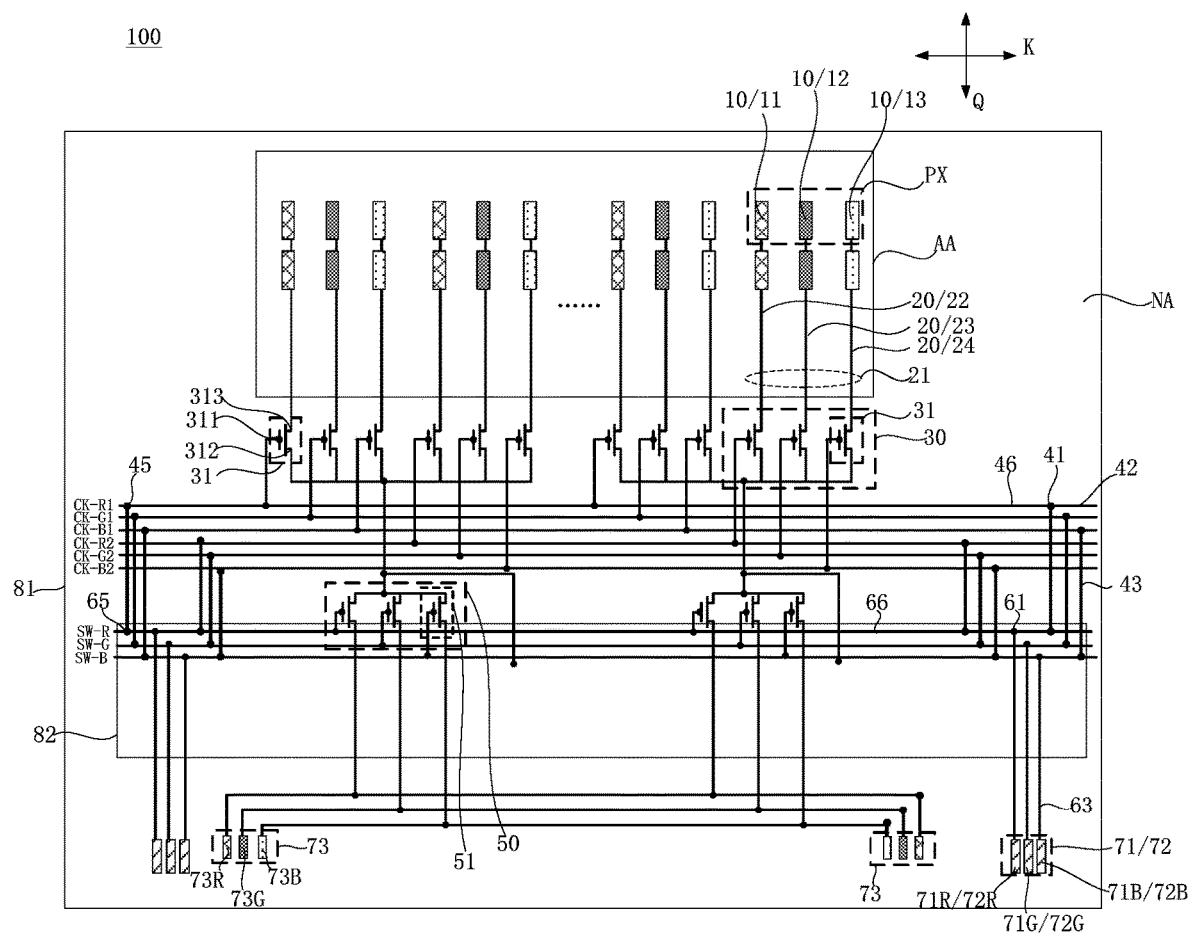
FIG. 12 illustrates another exemplary array substrate consistent with various disclosed embodiments of the present disclosure.

FIG. 12 is a schematic structural diagram of another array substrate consistent with various disclosed embodiments of the present disclosure. As shown in FIG. 12, in some embodiments, the array substrate 100 may include a substrate 81 and an integrated circuit bonding area 82 located on the substrate 81. Along the first direction Q, the test unit 50 may be disposed between the multiple-channel distribution unit 30 and the integrated circuit bonding area 82. Along the direction perpendicular to the plane where the substrate 81 is located, the first sub-inlet 43 may at least partially overlap with the integrated circuit bonding area 82, and the second sub-inlet 63 may at least partially overlap with the integrated circuit bonding area 82. Through such a configuration, the position of the test unit 50 may be reasonably arranged on the array substrate 100 to stably realize the VT detection of the display panel. At the same time, the IC chips bonded on the integrated circuit bonding area 82 may be electrically connected with the data lines 20 through the multiple-channel unit 30 and the test unit 50 to realize the control function of the IC chip on the display of the sub-pixels 10.

In some embodiments, the first switch element 31 and the second switch element 51 may be both N-type thin film transistors, or both P-type thin film transistors. Through such a configuration, the first switch element 31 and the second switch element 51 may be the same type of transistors, which may facilitate simplifying the types of control signals.

Thus, according to the present disclosure, the array substrate 100 may include a plurality of sub-pixels 10, a plurality of data lines 20, a plurality of multiple-channel distribution units 30, X first switch control lines 40, a plurality of test units 50, and N second switch control lines 60. The second control port 511 of the second switch element 51 of the test unit 50 may be connected to the second switch control line 60 in one-to-one correspondence such that the second switch control line 60 may select to turn on the second switch element 51 to allow the test signal to pass through the second switch element 51 of the test unit 50. By setting the second output port 513 of the second switch element 51 in the same test unit 50 to be electrically connected to the first input port 312 of the first switching element 31 in the same multiple-channel unit 30, the test signal may be transmitted to the first input port 312 of the first switch element 31 through the second switch element 51. Further, by setting the first control port 311 of the first switch element 31 of the multiple-channel distribution unit 30 to be connected to the first switch control line 40 in a one-to-one correspondence, the first switch control line 40 may select to turn on the first switch element 31, and the test signal may pass through the first switch element 31 of the multiple-channel distribution unit 30, and may be transmitted to the data lines 20. The data lines 20 may control each sub-pixel 10 to emit light. Accordingly, the visual test of the display panel may be realized; and whether the display panel is defective may be determined.

Figure 13:
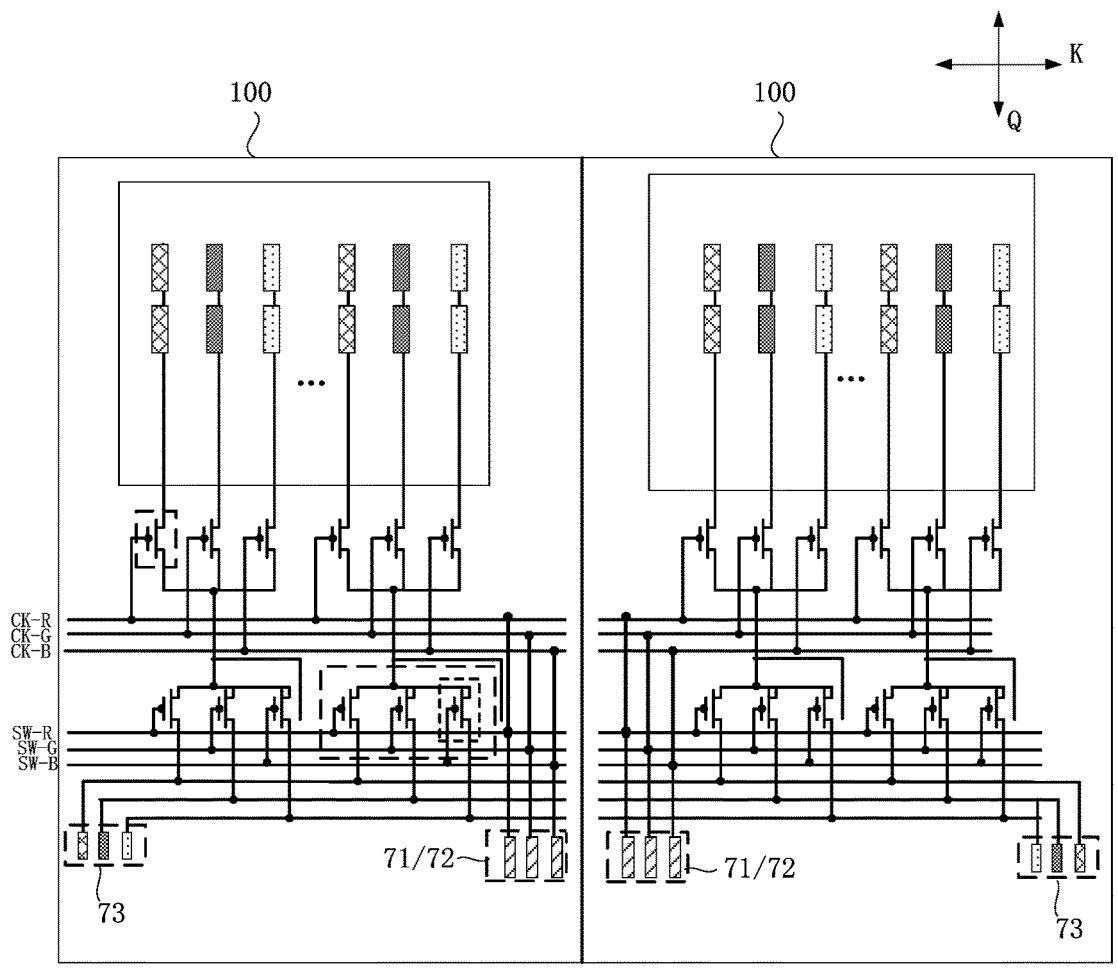
FIG. 13 illustrates an exemplary motherboard of an array substrate consistent with various disclosed embodiments of the present disclosure.

The present disclosure also provides a motherboard of an array substrate. FIG. 13 is a schematic structural diagram of an exemplary motherboard of an array substrate consistent with various disclosed embodiment of the present disclosure. As shown in FIG. 13, the motherboard of an array substrate may include an array substrate 100. The array substrate 100 may be a present disclosed array substrate or other appropriate array substrate.

In the motherboard of the array substrate, by setting the second switch control line 60 to control the on and off of the second switch element 51 of the test unit 50, and the first switch control line 40 to control the first switch element 31 of the multiple-channel distribution unit 30, when the first switch element 31 and the corresponding second switch element 51 are at the on state, the test signal in the array substrate 100 of the embodiment of the present disclosure may be transmitted to the first input port 312 of the first switch element 31 through the second output port 513 of the second switch element 51, and then transmitted to the corresponding data line 20 through the first output port 313 of the first switch element 31 to control the light-emitting display of the sub-pixel 10 electrically connected to the data line 20. When the array substrate 100 is applied to a display panel, the VT of the display panel may be realized.

In some embodiments, the motherboard of the array substrate may include at least two array substrates 100 and may be diced into individual array substrates 100. In the motherboard of the array substrate, the first control terminal 71 of two or more array substrates 100 may be multiplexed as the second control terminal 72. The first control terminal 71, the second control terminal and the signal terminal 73 may also be disposed on the edge area of the motherboard of the array substrate to optimize the layout of the motherboard of the array substrate, reduce the area of the motherboard of the array substrate, and save manufacturing materials.

Figure 14:
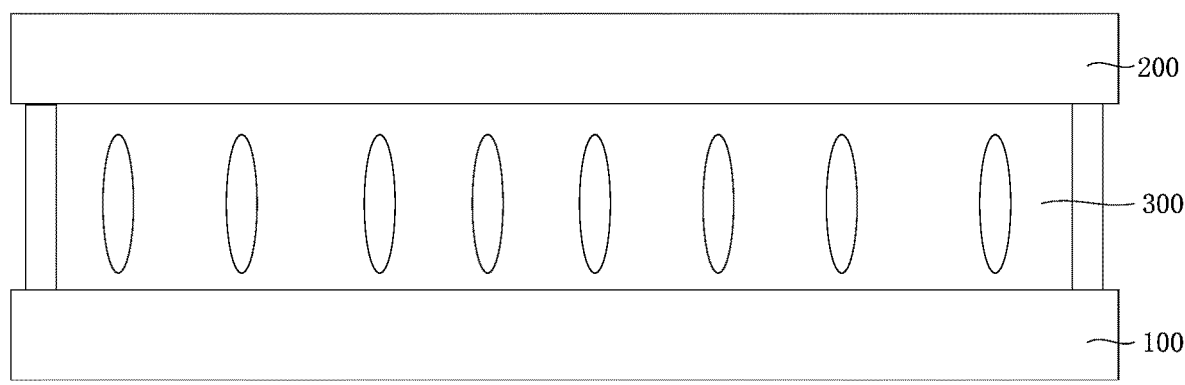
FIG. 14 illustrates an exemplary display panel consistent with various disclosed embodiments of the present disclosure.

The present disclosure also provides a display panel. FIG. 14 is a schematic structural diagram of an exemplary display panel consistent with various disclosed embodiments of the present disclosure.

As shown in FIG. 14, the display panel 1000 may an array substrate 100. The array substrate 100 may be the present disclosed array substrate 100 or other appropriate array substrate. The display panel 1000 of the embodiment of the present disclosure may be a liquid crystal display (LCD) panel or an organic light-emitting diode (OLED) display panel. The display panel 1000 of the embodiment of the present disclosure may have the same beneficial effects as the array substrate 100 of any of the foregoing embodiments.

In some embodiments, the display panel 1000 may further include a counter substrate 200 disposed opposite to the array substrate 100. When the display panel 1000 is a liquid crystal display (LCD) panel, the display panel 1000 may further include a display medium layer 300 disposed between the array substrate 100 and the counter substrate 200. In one embodiment, the display medium layer 300 may be a liquid crystal layer, and the display of the display panel 1000 is realized by controlling the deflection of the liquid crystal layer.

Figure 15:
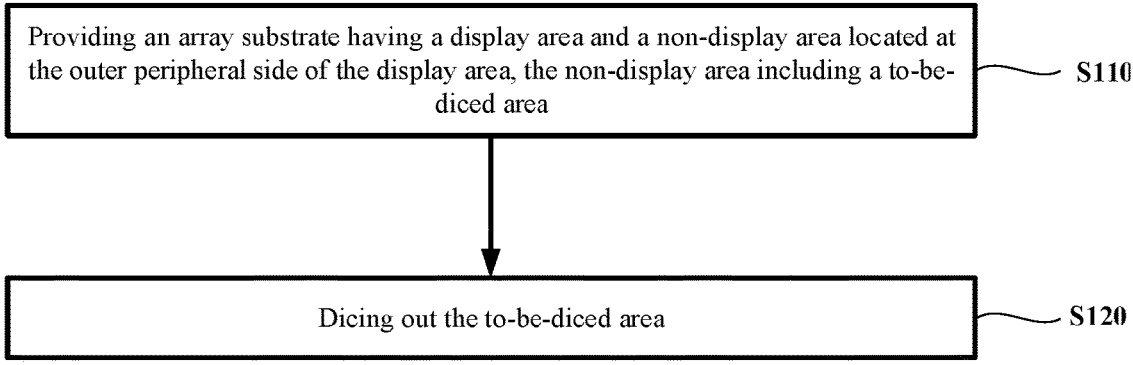
FIG. 15 illustrates a flow chart of an exemplary fabrication method of a display panel consistent with various disclosed embodiments of the present disclosure.
Figure 16:
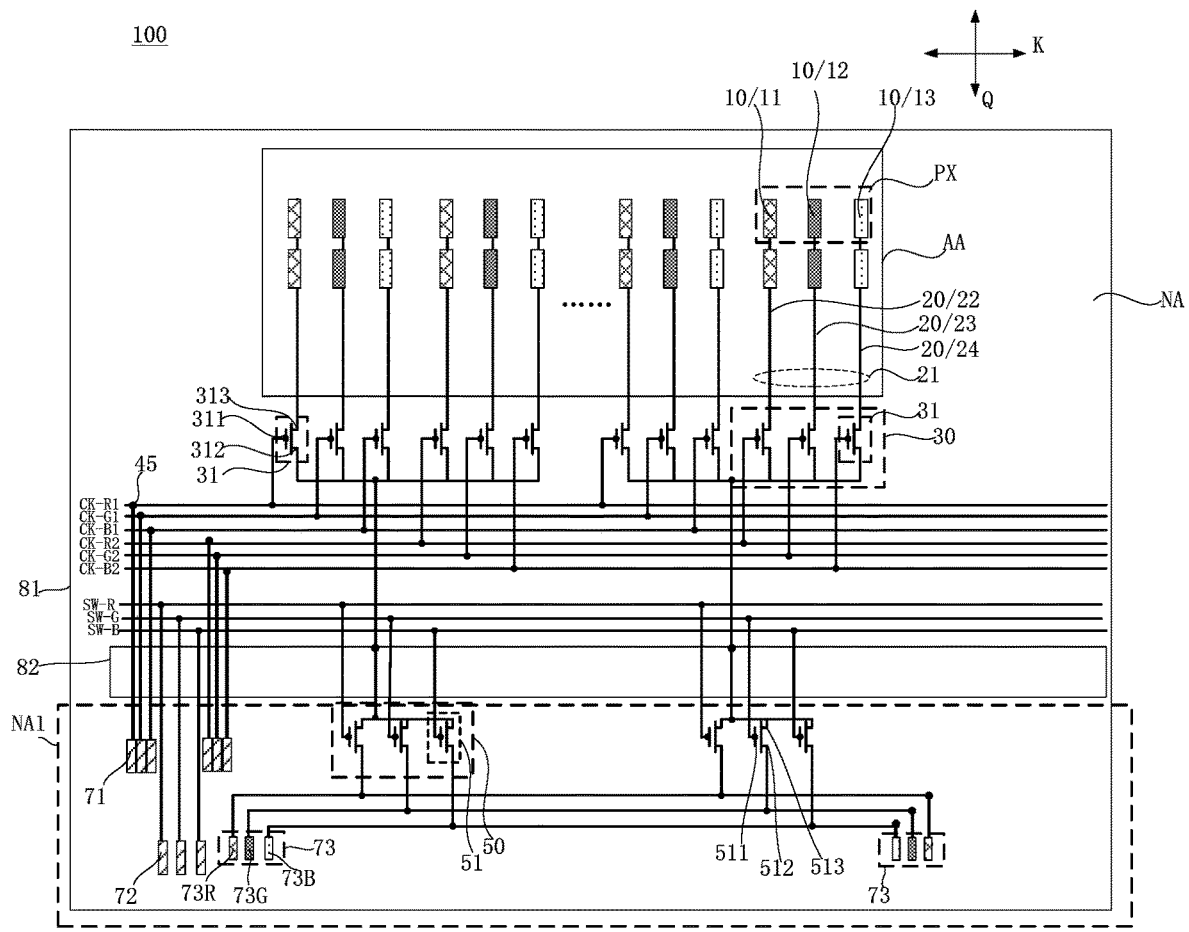
FIG. 16 illustrates an exemplary array substrate consistent with various disclosed embodiments of the present disclosure.
Figure 17:
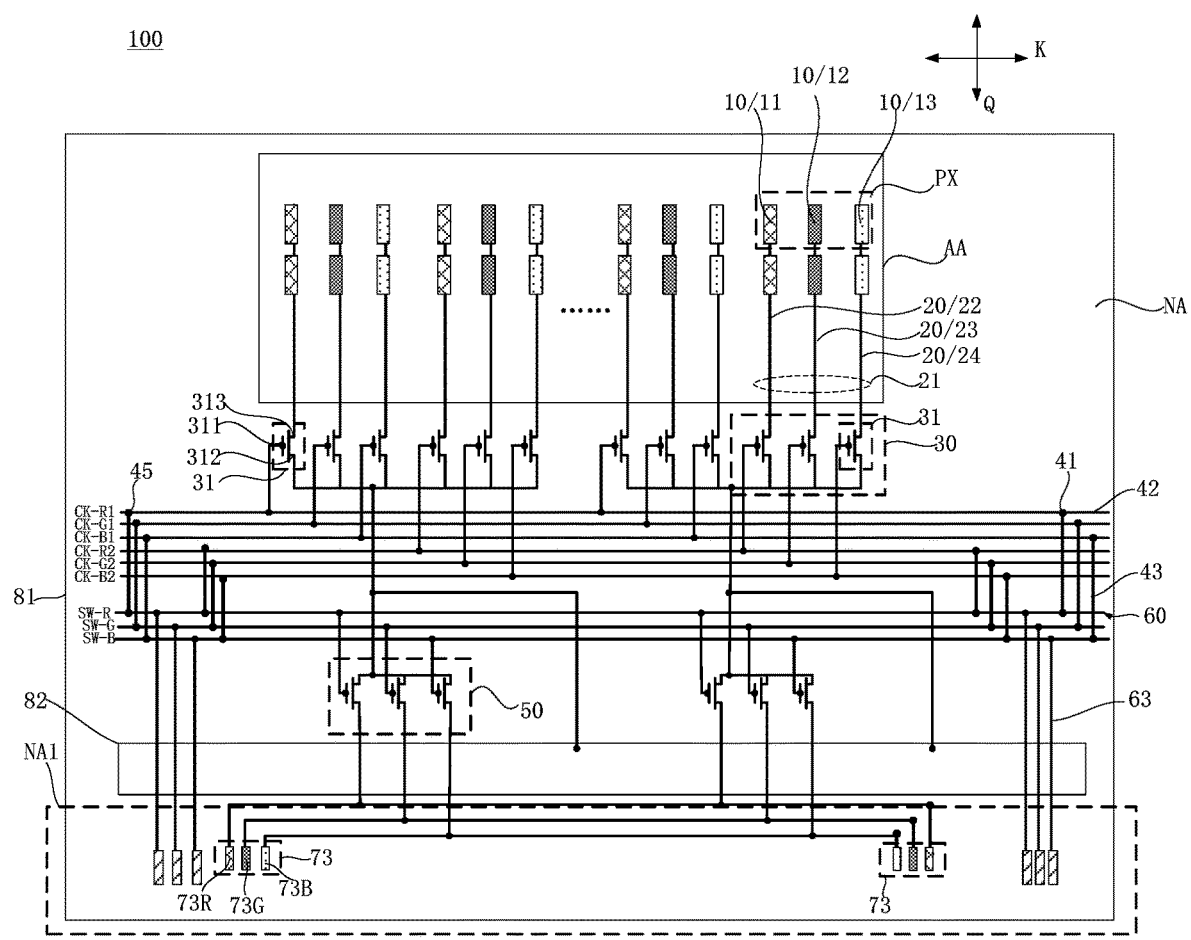
FIG. 17 illustrates another exemplary array substrate consistent with various disclosed embodiments of the present disclosure.
Figure 18:
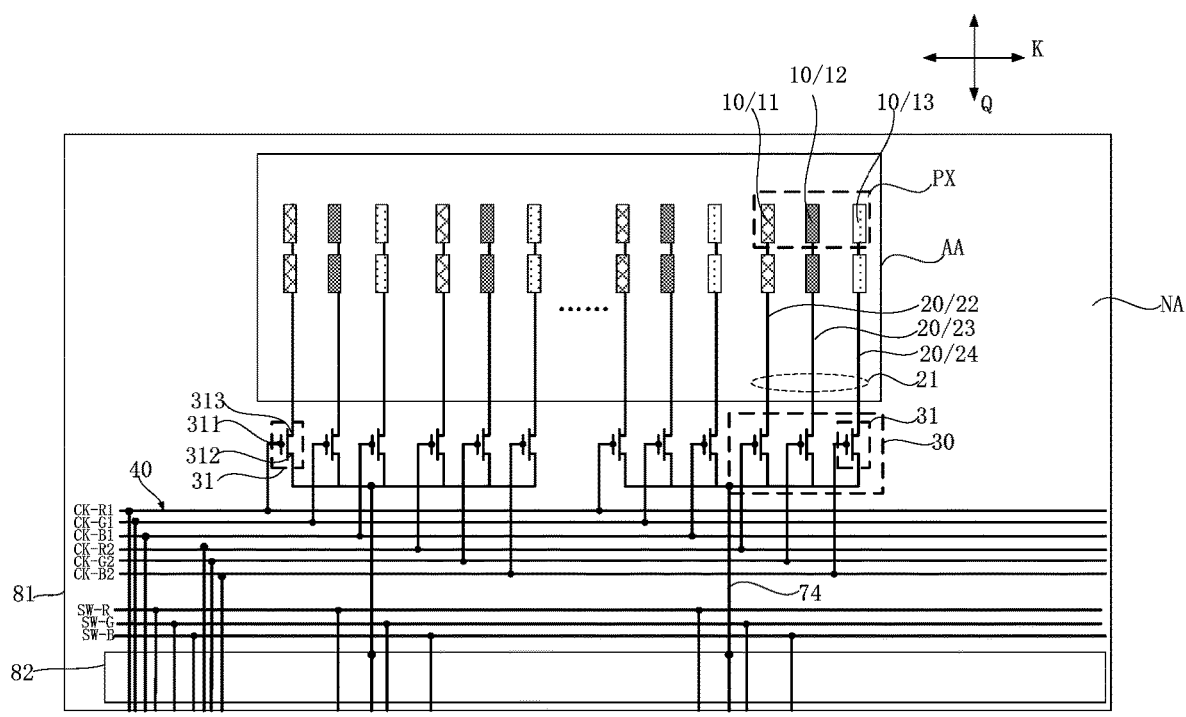
FIG. 18 illustrates an exemplary array substrate after dicing out the to-be-diced area consistent with various disclosed embodiments of the present disclosure.

The present disclosure also provides a method for forming a display panel. FIG. 15 is a schematic flowchart of an exemplary method for forming a display panel consistent with various disclosed embodiments of the present disclosure. FIG. 16 is a schematic structural diagram of an exemplary array substrate consistent with various disclosed embodiments of the present disclosure. FIG. 17 is a schematic structural diagram of an exemplary array substrate consistent with various disclosed embodiments of the present disclosure. FIG. 18 is a schematic structural diagram of an exemplary array substrate after dicing the to-be-diced area consistent with various disclosed embodiments of the present disclosure.

As shown in FIGS. 15-18, the method may include:

S110: providing an array substrate 100. The array substrate 100 may include a display area AA and a non-display area NA located on the outer peripheral side of the display area AA. The non-display area NA may include a to-be-diced area NA1. In one embodiment, the array substrate 100 may be the array substrate 100 of any one of the foregoing embodiments; and S120: dicing out the to-be-diced area NA1.

According to the display panel 100 formed by the present disclosed method, during the VT test, the test signal may be transmitted to the first input port 312 of the first switch element 31 through the second output port 513 of the second switch element 51, and then transmitted to the corresponding data line 20 through the first output port 313 of the first switch element 31 to control the light-emitting display of the sub-pixel 10 electrically connected to the data line 20 to test the display panel 1000. By dicing off the to-be-diced area NA1, the size of the display panel 1000 may be reduced, and the narrow bezel requirement of the display panel 1000 may be further realized, which may be convenient for popularization and application.

As shown in FIGS. 16-17, in some embodiments, the array substrate 100 may further include a first control terminal 71, a second control terminal 72, and a signal terminal 73. The non-display area NA may also include an integrated circuit bonding area 82. The multiple-channel distribution unit 30 may be located at the side of the integrated circuit bonding area 82 adjacent to the display area AA, and the to-be-diced area NA1 may be located at the side of the integrated circuit bonding area 82 away from the display area AA. At least one of the test unit 50, the first control terminal 71, the second control terminal 72 and the signal terminal 73 may be located in the to-be-diced area NA1. Through such a configuration, the positions of the control terminals, signal terminals, and the test unit 50 may be reasonably arranged, and the to-be-diced area NA1 may be reasonably set. After the to-be-diced area NA1 is diced out, the bezel area of the display panel 1000 may be reduced.

As shown in FIG. 17, in some embodiments, the test unit 50 may be located at the side of the integrated circuit bonding area 82 adjacent to the display area AA, and at least one of the first control terminal 71, the second control terminal 72 and the signal terminal 73 may be located in the to-be-diced area NA1. Through such a configuration, the to-be-diced area NA1 may be set reasonably. After the to-be-diced area NA1 is diced, the bezel area of the display panel 1000 may be reduced.

As shown in FIG. 16, in some embodiments, the test unit 50 may be located at the side of the integrated circuit bonding area 82 away from the display area AA, and the test unit 50, the first control terminal 71 and the second control terminal 72 may all be located in the to-be-diced area NA1. Through such a configuration, the to-be-cut area NA1 may be set reasonably, and after the to-be-diced area NA1 is diced, the bezel area of the display panel 1000 may be reduced.

As shown in FIG. 18, in some embodiments, after dicing the to-be-diced area NA1, the array substrate 100 may have a display area AA and a non-display area NA located on the outer peripheral side of the display area AA. The non-display area NA may include an integrated circuit bonding area 82. The array substrate 100 may include a plurality of sub-pixels 10, a plurality of data lines 20, a plurality of multiple-channel distribution units 30 and X first switch control lines 40. At least a portion (i.e., a certain number) of the plurality of sub-pixels 10 and the plurality of data lines 20 may be located in the display area AA; and the plurality of multiple-channel distribution units 30 and X first switch control lines 40 may all be located in the non-display area NA.

According to the array substrate, the motherboard of the array substrate, the display panel, and the fabrication method of the display panel of the present disclosure, the array substrate may include a plurality of sub-pixels, a plurality of data lines, a plurality of multiple-channel distribution units, X first switch control lines, a plurality of test units and N second switch control lines. By setting the second control port of the second switch element of the test unit to be electrically connected to the second switch control line in one-to-one correspondence, the second switch control line may be able to select to turn on the second switch control line to allow the test signal to pass through the second switch element of the test unit. By setting the second output port of the second switch element in the same test unit to be electrically connected to the first input port of the first switch element in the same multiple-channel distribution unit, the test signal may be transmitted to the first input port of the first switch element through the second switch element. Further, by setting the first control port of the first switch element of the multiple-channel distribution unit to be electrically connected to the first switch control line in a one-to-one correspondence, the first switch control line may select to turn on the first switch element to allow the test signal to pass through the first switch element of the multiple-channel distribution unit to be transmitted to the data line control the light-emission display of each sub-pixel. Accordingly, the the visual test of the display panel may be realized, and whether the display panel is defective may be determined.

According to the above embodiments of the present disclosure, these embodiments do not describe all the details in detail, nor do they limit the present disclosure to only the specific embodiments described. Obviously, based on the above description, many modifications and changes can be made. This specification selects and specifically describes these embodiments in order to better explain the principles and practical applications of the present disclosure such that those skilled in the art can make good use of the present disclosure and make modifications based on the present disclosure. The present disclosure is only limited by the claims and their full scope and equivalents.

It should be noted that the above are only the preferred embodiments of the present disclosure and the applied technical principles. Those skilled in the art will understand that the present disclosure is not limited to the specific embodiments described herein, and various obvious changes, readjustments, mutual combinations and substitutions can be made to those skilled in the art without departing from the protection scope of the present disclosure. Therefore, although the present disclosure has been described in more detail through the above embodiments, the present disclosure is not limited to the above embodiments, and can also include more other equivalent embodiments without departing from the concept of the present disclosure. The scope of is determined by the scope of the appended claims.

What is claimed is:

1. An array substrate, comprising:
a plurality of sub-pixels, wherein a number N of adjacent sub-pixels of the plurality of sub-pixels form a first pixel unit;
a plurality of data lines, extending along a first direction and distributed along a second direction intersecting the first direction, wherein a number X of data lines of a number M of columns of sub-pixels of the plurality of sub-pixels form a data line group, X=M×N, N≥3, N is an integer, and M is a positive integer;
a plurality of multiple-channel distribution units, wherein each multiple-channel distribution unit includes the number X of first switch elements having a one-to-one correspondence with the number X of data lines, each first switch element includes a first control port, a first input port and a first output port, first input ports of the number X of first switch elements of a same multiple-channel distribution unit are connected together, and first output ports of the number X of first switch elements of the same multiple-channel distribution unit are connected to the X data lines of a same date line group with a one-to-one correspondence;
a number X of first switch control lines, wherein first control ports of the number X of first switch elements in each multiple-channel distribution unit are connected to the number X of first switch control lines with a one-to-one correspondence, the number X of first switch control lines comprising a first sub-switch control line that includes a first sub-line portion;
a plurality of test units having a one-to-one correspondence with the plurality of multiple-channel distribution units, each test unit includes the number N of second switch elements, each second switch element includes a second control port, a second input port and a second output port, second input ports of the number N of second switch elements of a same test unit are connected together, and second output ports of second switch elements of the same test unit are electrically connected to first input ports of first switch elements in the same multiple-channel distribution unit; and a number N of second switch control lines, wherein second control ports of the number N of second switch elements of each test unit are connected to the number N of second switch control lines with a one-to-one correspondence, the number N of second switch control lines comprising a second sub-switch control line that includes a second sub-line portion, wherein the first sub-line portion is located at a first side of the first node and a number of first switch elements electrically connected with the first sub-line portion is p1;

the second sub-line portion is located at a first side of the second node and a number of second switch elements electrically connected with the second sub-line portion is q1;

|p1−q1|≤k; p1≥0 and p1 is an integer; q1≥0 and q1 is an integer; and k is a preset threshold value.

2. The array substrate according to claim 1, wherein:
the first sub-switch control line further includes a first sub-inlet portion connected to a first node;
an extension direction of the first sub-line portion intersects the first direction;
an extension direction of the first sub-inlet portion intersects the second direction;
the array substrate also includes a first control terminal electrically connected to the first sub-inlet portion;
the second sub-switch control line further includes a second sub-inlet portion connected to a second node;
an extension direction of the second sub-line portion intersects the first direction;
an extension direction of the second sub-inlet portion intersects the second direction;
the array substrate also includes a second control terminal electrically connected to the second sub-inlet portion;
the array substrate also includes a signal terminal electrically connected to the second input port of the second switch element; and
the first sub-switch line and the second sub-switch line are all configured to control a signal transmission of data lines corresponding to sub-pixels of a same color.

3. The array substrate according to claim 2, wherein:
the second control terminal is multiplexed as the first control terminal.

4. The array substrate according to claim 2, wherein:
p1=q1>0; and
k=0.

5. The array substrate according to claim 4, wherein:
the first sub-switch control line further includes a third sub-line portion having an extension direction intersecting the first direction;
the third sub-line portion is connected with the first sub-line portion at the first node;
the second sub-switch control line further includes a fourth sub-line portion having an extension direction intersecting the first direction;
the fourth sub-line portion is connected with the second sub-line portion at the second node;
the third sub-line portion is located a second side of the first node and a number of first switch elements electrically connected to the third sub-line portion is p2;

the fourth sub-line portion is located at the second side of the second node and a number of second switch elements electrically connected to the fourth sub-line portion is q2;
p2 is a positive integer;
q2 is a positive integer; and
the first side is different from the second side.

6. The array substrate according to claim 5, wherein:
p1=p2; and
q1=q2.

7. The array substrate according to claim 2, wherein:
the first sub-switch control line further includes at least one third node and a first sub-connection line portion connecting the first node and the at least one third node and a number of first switch elements connected to the first sub-connection line portion is p3;
the second sub-switch control line further includes at least one fourth node and a second sub-connection line portion connecting the second node and the at least one fourth node and a number of first switch elements connected to the second sub-connection line portion is q3;
p3 is a positive integer; and
q3 is a positive integer.

8. The array substrate according to claim 2, wherein:
the array substrate includes a substrate and an integrated circuit bonding area on the substrate;
along the first direction, the integrated circuit bonding area is located between the plurality of multiple-channel distribution units and the plurality of test units; and
along a direction perpendicular to a plane where the substrate is located, the first sub-inlet portion and the integrated circuit bonding area at least partially overlap, and/or the second sub-inlet portion and the integrated circuit bonding area at least partially overlap.

9. The array substrate according to claim 2, wherein:
the array substrate includes a substrate and an integrated circuit bonding area on the substrate;
along the first direction, the plurality of test units are located between the plurality of multiple-channel distribution units and the integrated circuit bonding area; and
along a direction perpendicular to a plane where the substrate is located, the first sub-inlet portion and the integrated circuit bonding area at least partially overlap, and the second sub-inlet portion and the integrated circuit bonding area at least partially overlap.

10. The array substrate according to claim 2, further comprising:
the number N of signal terminals,
wherein, in a same pixel unit, the N data lines respectively connected to the number N of sub-pixels of different colors are connected to the number N of signal terminals, respectively through different first switch elements and second switch elements, with a one-to-one correspondence.

11. The array substrate according to claim 1, wherein:
the number X of first switch elements and the number N of second switch elements are all N-type thin-film transistors or all P-type thin-film transistors.

12. The array substrate according to claim 1, wherein:
N=3.

13. The array substrate according to claim 1, wherein:
M=2.

14. A motherboard of an array substrate, comprising the array substrate according to claim 1.

15. A display panel, comprising:
an array substrate, including:
a plurality of sub-pixels, wherein a number N of adjacent sub-pixels of the plurality of sub-pixels form a first pixel unit;
a plurality of data lines, extending along a first direction and distributed along a second direction intersecting the first direction, wherein a number X of data lines of a number M of columns of sub-pixels of the plurality of sub-pixels form a data line group, X=M×N, N≥3, N is an integer, and M is a positive integer;
a plurality of multiple-channel distribution units, wherein each multiple-channel distribution unit includes the number X of first switch elements having a one-to-one correspondence with the number X of data lines, each first switch element includes a first control port, a first input port and a first output port, first input ports of the number X of first switch elements of a same multiple-channel distribution unit are connected together, and first output ports of the number X of first switch elements of the same multiple-channel distribution unit are connected to the X data lines of a same date line group with a one-to-one correspondence;
a number X of first switch control lines, wherein first control ports of the number X of first switch elements in each multiple-channel distribution unit are connected to the number X of first switch control lines with a one-to-one correspondence, the number X of first switch control lines comprising a first sub-switch control line that includes a first sub-line portion;
a plurality of test units having a one-to-one correspondence with the plurality of multiple-channel distribution units, each test unit includes the number N of second switch elements, each second switch element includes a second control port, a second input port and a second output port, second input ports of the number N of second switch elements of a same test unit are connected together, and second output ports of second switch elements of the same test unit are electrically connected to first input ports of first switch elements in the same multiple-channel distribution unit; and
a number N of second switch control lines, wherein second control ports of the number N of second switch elements of each test unit are connected to the number N of second switch control lines with a one-to-one correspondence, the number N of second switch control lines comprising a second sub-switch control line that includes a second sub-line portion, wherein
the first sub-line portion is located at a first side of the first node and a number of first switch elements electrically connected with the first sub-line portion is p1;
the second sub-line portion is located at a first side of the second node and a number of second switch elements electrically connected with the second sub-line portion is q1;
|p1−q1|≤k; p1≥0 and p1 is an integer; q1≥0 and q1 is an integer; and k is a preset threshold value.

16. A method for forming a display panel, comprising:
providing an array substrate,
wherein the array substrate includes:
a display area, and a non-display area located at an outer peripheral side of the display area and including a to-be-diced area;
a plurality of sub-pixels, wherein a number N of adjacent sub-pixels of the plurality of sub-pixels form a first pixel unit;
a plurality of data lines, extending along a first direction and distributed along a second direction intersecting the first direction, wherein a number X of data lines of a number M of columns of sub-pixels of the plurality of sub-pixels form a data line group, X=M×N, N≥3, N is an integer, and M is a positive integer;
a plurality of multiple-channel distribution units, wherein each multiple-channel distribution unit includes the number X of first switch elements having a one-to-one correspondence with the X data lines, each first switch element includes a first control port, a first input port and a first output port, first input ports of the X first switch elements of a same multiple-channel distribution unit are connected together, and first output ports of the X first switch elements of the same multiple-channel distribution unit are connected to the X data lines of a same date line group with a one-to-one correspondence;
the number X of first switch control lines, wherein first control ports of the number X of first switch elements in each multiple-channel distribution unit are connected to the number X of first switch control lines with a one-to-one correspondence, the number X of first switch control lines comprising a first sub-switch control line that includes a first sub-line portion;
a plurality of test units having a one-to-one correspondence with the plurality of multiple-channel distribution units, each test unit includes the number N of second switch elements, each second switch element includes a second control port, a second input port and a second output port, second input ports of the number N of second switch elements of a same test unit are connected together, and second output ports of second switch elements of the same test unit are electrically connected to first input ports of first switch elements in the same multiple-channel distribution unit; and
the number N of second switch control lines, wherein second control ports of the number N of second switch elements of each test unit are connected to the N second switch control lines with a one-to-one correspondence, the number N of second switch control lines comprising a second sub-switch control line that includes a second sub-line portion, wherein
the first sub-line portion is located at a first side of the first node and a number of first switch elements electrically connected with the first sub-line portion is p1;
the second sub-line portion is located at a first side of the second node and a number of second switch elements electrically connected with the second sub-line portion Ls q1;
|p1−q1|≤k; p1≥0 and p1 is an integer; q1≥0 and q1 is an integer; and k is a preset threshold value; and
dicing off the to-be-diced area.

17. The method according to claim 16, wherein:
the array substrate further includes a first control terminal, a second control terminal and a signal terminal;
the non-display area also includes an integrated circuit bonding area;
the plurality of multiple-channel distribution units are located at a side of the integrated circuit bonding area adjacent to the display area;
the to-be-diced area is located at a side of the integrated circuit bonding area away from the display area; and
at least one of the plurality of test units, the first control terminal, the second control terminal, or the signal terminal is located in the to-be-diced area.

18. The method according to claim 17, wherein:

the plurality of test units are disposed at a side of the integrated circuit bonding area adjacent to the display area; and at least one of the first control terminal, the second control terminal, or the signal terminal is located in the to-be-diced area.

19. The method according to claim 17, wherein:

the plurality of test units are disposed at a side of the integrated circuit bonding area away from the display area; and all of the plurality of test units, the first control terminal, and the second control terminal are located in the to-be-diced area.

20. The method according to claim 16, wherein:

the first sub-switch control line further includes a first sub-inlet portion connected to a first node;

an extension direction of the first sub-line portion intersects the first direction;

an extension direction of the first sub-inlet portion intersects the second direction;

the array substrate also includes a first control terminal electrically connected to the first sub-inlet portion;

the second sub-switch control line further includes a second sub-inlet portion connected to a second node;

an extension direction of the second sub-line portion intersects the first direction;

an extension direction of the second sub-inlet portion intersects the second direction;

the array substrate also includes a second control terminal electrically connected to the second sub-inlet portion;

the array substrate also includes a signal terminal electrically connected to the second input port of the second switch element; and the first sub-switch line and the second sub-switch line are all configured to control a signal transmission of data lines corresponding to sub-pixels of a same color.

\* \* \* \* \*